United States Patent
Kang et al.

(10) Patent No.: US 7,098,092 B2
(45) Date of Patent: Aug. 29, 2006

(54) SINGLE ELECTRON DEVICE, METHOD OF MANUFACTURING THE SAME, AND METHOD OF SIMULTANEOUSLY MANUFACTURING SINGLE ELECTRON DEVICE AND MOS TRANSISTOR

(75) Inventors: Tae Woong Kang, Daejon-Shi (KR); Seong Jae Lee, Daejon-Shi (KR)

(73) Assignee: Electronics and Telecommunications Research Institute, (KR)

( * ) Notice: Subject to any disclaimer, the term of this patent is extended or adjusted under 35 U.S.C. 154(b) by 26 days.

(21) Appl. No.: 10/691,852

(22) Filed: Oct. 22, 2003

(65) Prior Publication Data

US 2004/0108529 A1   Jun. 10, 2004

(30) Foreign Application Priority Data

Dec. 10, 2002   (KR)   ........................ 10-2002-0078445

(51) Int. Cl.
*H01L 21/84*   (2006.01)
(52) U.S. Cl. .................. 438/163; 438/149; 438/164; 438/275; 438/486
(58) Field of Classification Search ............. 438/149, 438/151, 161, 163, 164, 197, 275, 479, 482, 438/486; 257/17, 20, 30, 51, 64, 66, 67, 257/69; 977/DIG. 1
See application file for complete search history.

(56) References Cited

U.S. PATENT DOCUMENTS

| | | | |
|---|---|---|---|
| 5,612,233 A | | 3/1997 | Roesner et al. |
| 5,731,598 A | | 3/1998 | Kado et al. |
| 6,060,743 A | * | 5/2000 | Sugiyama et al. ......... 257/321 |
| 6,103,600 A | * | 8/2000 | Ueda et al. ............... 438/503 |
| 6,198,113 B1 | * | 3/2001 | Grupp .................... 257/39 |
| 6,414,333 B1 | | 7/2002 | Lee et al. |
| 6,586,787 B1 | * | 7/2003 | Shih et al. ............... 257/288 |
| 6,673,717 B1 | * | 1/2004 | Brousseau, III ........... 438/674 |
| 6,723,606 B1 | * | 4/2004 | Flagan et al. ............. 438/264 |
| 2002/0167002 A1 | * | 11/2002 | Chae et al. ............... 257/20 |

FOREIGN PATENT DOCUMENTS

JP   08-064525   3/1996

(Continued)

OTHER PUBLICATIONS

Complementary digital logic based on the "coulomb blockade", pp. 4399-4413.

(Continued)

*Primary Examiner*—N. Drew Richards
(74) *Attorney, Agent, or Firm*—Blakely Sokoloff Taylor & Zafman

(57) ABSTRACT

Disclosed is to a single electron device, a method of manufacturing the same, and a method of simultaneously manufacturing a single electron device and an MOS transistor. Accordingly, the single electron device of the present invention comprises, on a substrate, semiconductor layers in which a source region and a drain region spaced a predetermined distance apart are formed, hemisphere-type silicon layer formed between the semiconductor layers as an active layer, the hemisphere-type silicon layer having a plurality of electron islands, a gate insulating layer formed on a top surface of the entire structure, and a gate electrode formed on the gate insulating layer in order to apply voltage to the active layer.

9 Claims, 22 Drawing Sheets

FOREIGN PATENT DOCUMENTS

| | | |
|---|---|---|
| JP | 08-078669 | 3/1996 |
| JP | 10-242402 | 9/1998 |
| JP | 11-040809 | 2/1999 |
| JP | 11-345959 | 12/1999 |
| JP | 2002-076358 | 3/2002 |
| KR | 1020000025200 | 5/2000 |
| KR | 1020020038274 | 5/2002 |
| WO | WO 98/50958 | 11/1998 |

OTHER PUBLICATIONS

Physical Review Letters, vol. 82, No. 6, Feb. 8, 1999, pp. 1245-1248.

IBM J. Res. Develop., vol. 32, No. 1, Jan. 1988, pp. 144-158.

* cited by examiner

SINGLE ELECTRON DEVICE, METHOD OF MANUFACTURING THE SAME, AND METHOD OF SIMULTANEOUSLY MANUFACTURING SINGLE ELECTRON DEVICE AND MOS TRANSISTOR

BACKGROUND OF THE INVENTION

1. Field of the Invention

The present invention relates to a single electron device, and more particular, to a single electron device where electron islands are effectively formed using HSG (Hemispherical grained) silicon process, a method of manufacturing the same, and a method of simultaneously manufacturing a single electron device and an MOS transistor.

2. Description of the Prior Art

A single electron device is an ultimate structure of electronic device which can be controlled with one electron. Based on a transistor concept, single electron devices having a structure similar to an FET (Field Effect Transistor) have already been proposed and researched for implementing ultra high integrated memories or super low-power consumption circuits. In addition, various element structures and circuits with a new concept have been researched.

Hereinafter, operation principles of a single electron device will be explained with reference to FIGS. 1 and 2. FIG. 1 is a schematic view illustrating a single electron device having a structure similar to an FET.

An electron island 120 is surrounded by two tunnel junctions 115 and 125 and a capacitor 135, where the tunnel junctions 115 and 125 have resistance and capacitance characteristics of ($R_1$, $C_1$) and ($R_2$, $C_2$) respectively, and the capacitance of the capacitor 135 is $C_g$. A constant bias voltage V is applied to a node denoted by A and a control voltage, $V_g$ is applied to a node denoted by B in FIG. 1. Such structure is very similar to that of an MOSFET, where two nodes A and C correspond to a source and a drain, respectively, and the input node B corresponds to a gate. The electron transport characteristic with such configurations is shown in FIG. 2 where current oscillation phenomena are manifested due to the Coulomb blockade effect.

That is, as shown in FIG. 2, an oscillating pattern of the current with respect to $V_g$ having a period of $e/C_g$ is obtained. FIG. 2 shows a relationship between the control voltage $V_g$ for controlling the potential of the electron island 120 and the current, i flowing the electron island through tunnel junctions with the applied voltage V. Herein, a peak region represents a conducting state and a valley region represents an insulating state by the Coulomb blockade. Further, the period, e/Cg represents a transition between states of total charges differed by e, a single electron's charge, which means that a source-drain current can be modulated by induced charges smaller than e, a single electron's charge. Therefore, this device is called a single electron transistor.

When tunnel junctions 115 and 125 have resistance and capacitance values of ($R_1$, $C_1$) and ($R_2$, $C_2$) and the capacitor 135 has a capacitance of $C_g$, the conditions for a single electron behavior having the characteristic as shown in FIG. 2 are as follows;

$$R_i \gg h/e^2 \sim 26 \, k\Omega \text{ (herein, } I \approx 1, 2)$$ (Equation 1)

$$e^2/C_t \gg k_B T \text{ (herein, } C_t = C_1 + C_2 + C_g)$$ (Equation 2)

The equation 1 describe the condition for the localization of a electron island 120 that can discriminate the tunneling electron one by one, and the equation 2 describes the condition that the electron tunneled into the electron island 120 can block other thermally activated electrons. As can be seen from the equation 1, the resistance of the tunnel junctions should be higher than hundreds of kΩ. As can also be seen from the equation 2, the size of the device should be smaller than tens of nanometers in order for the electron island 120 to have small capacitance enough for room temperature operation.

To meet those conditions, it is essential to develop the technology where electron islands with nanometers of size are uniformly formed using silicon in order to manufacture a single electron device compatible with conventional MOS transistor technologies. In current state of nanofabrication technique, it is only the electron beam direct lithography method to meet such a stringent requirement for sub-10 nm scale lithography, but it is not suitable for mass production.

Therefore it is urgent to develop new technique toward nanoscale fabrication processes especially for silicon in order to realize integrated circuits of single electron transistors which have merits in high integration and low power.

SUMMARY OF THE INVENTION

Therefore, to solve the above-mentioned problems, it is an object of the present invention to effectively form silicon nano dots as electron islands of single electron devices.

It is another object of the present invention is to provide a single electron device and a method of manufacturing the same, the single electron device being easily mass produced and being compatible with a conventional MOS transistor manufacturing process.

To achieve the above-described objects, in accordance with an aspect of the present invention, there is provided a single electron device which comprises, a source electrode and a drain electrode of semiconductor layer, formed on a substrate, the source electrode and the drain electrode being spaced a predetermined distance apart each other; a hemisphere-type silicon layer, as an active layer, formed between the source electrode and the drain electrode, the hemisphere-type silicon layer having a plurality of electron islands; a gate insulating layer formed on a top surface of the entire structure; and a gate electrode formed on the gate insulating layer in order to apply voltage to the active layer.

The predetermined distance between source and drain regions in the semiconductor layer is 100 nm or less, the thickness of the hemisphere-type silicon layers is in the range of 3 to 5 nm, and the size of silicon electron islands is in the range of 3 to 5 nm.

Further, in accordance with another aspect of the present invention, there is provided a method of manufacturing single electron device which comprises the steps of, on a substrate: forming source/drain regions of semiconductor layer, the source region and the drain region being spaced a predetermined distance apart each other; defining active region between the source and the drain region by depositing an amorphous silicon layer on the semiconductor layer; changing the amorphous silicon layer into a hemisphere-type silicon layer having a plurality of silicon electron islands; forming a gate insulating layer on the top surface of the entire structure; and forming a gate electrode on the gate insulating layer in order to apply voltages to the active regions.

Then, the step of forming the hemisphere-type silicon layer comprises a step of spraying a silicon contained gas for a first predetermined time while maintaining the amorphous silicon layer under the condition of a temperature of 500 to 700° C. and a high vacuum state not more than 1 to 3×10E$^{-7}$ torr, and a step of performing heat treatment for a second predetermined time at a temperature of 500 to 700° C.

In such case, the silicon contained gas is $SiH_4$ or $Si_2H_6$, the first predetermined time is in the range of 10 to 170 seconds, and the second predetermined time is in the range of 10 to 90 seconds.

Preferably, a type of a substrate is an SOI substrate, and the semiconductor layer may be the most upper layer of the SOI substrate.

In accordance with a further aspect of the present invention, there is provided a method of simultaneously manufacturing a single electron device and an MOS transistor which comprises the steps of: defining a single electron device region (hereinafter, A region) and an MOS transistor region (hereinafter, B region); depositing a semiconductor layer entirely on the A region and B region; defining a source and drain region of the single electron device in the A region, the source and the drain region of the A region being spaced a predetermined distance apart each other, and simultaneously defining a source, a drain, and an active region of the MOS transistor with one body in the B region; after depositing an amorphous silicon layer on the semiconductor layer, defining an active region of the single electron device only between the source and drain regions on the A region; changing the amorphous silicon layer of the A region into a hemisphere-type silicon layer having plurality of silicon electron islands; forming a gate insulating layer on the top surface of the entire structure; forming a gate electrode on the gate insulating layer; and forming source/drain electrodes of the single electron device and the MOS transistor.

In addition, the step of forming the gate insulating layer comprises a step of forming a first gate insulating layer on only the A region after covering the B region with photoresist and a step of forming a second gate insulating layer on the entire structure, wherein the thickness of the gate insulating layer in the A region is bigger than that of the gate insulating layer in the B region.

Many researches have been utilized "the hemisphere-type silicon forming technology" in forming capacitors in DRAM. Accordingly, there is no problem associated with applying it to a large aperture wafer, and it has an advantage for mass production. Since conventional hemisphere-type silicon forming technologies have focused mainly on increasing a surface area, the area of the formed silicon is several hundred nanometers and is much larger than that of the electron island that the single electron transistor requires. However, it has been found that the electron island can be uniformly formed with several nanometer sizes, given various conditions. This will be described below in detail.

BRIEF DESCRIPTION OF THE ATTACHED DRAWINGS

FIGS. 4A, 4B to 11A, 11B show a flow chart illustrating a method of simultaneously manufacturing a single electron transistor and an MOS transistor in accordance with the preferred embodiment of the present invention.

DESCRIPTION OF THE PREFERRED EMBODIMENTS

Hereinafter, an embodiment of a method of simultaneously manufacturing a single electron transistor and an MOS transistor using hemisphere-type silicon forming technologies with reference to FIGS. 3, 4A, and 4B to 11A, and 11B will be explained. However, the single electron transistor does not need to be manufactured with the MOS transistor at the same time, and it can be individually manufactured.

Figure 1:
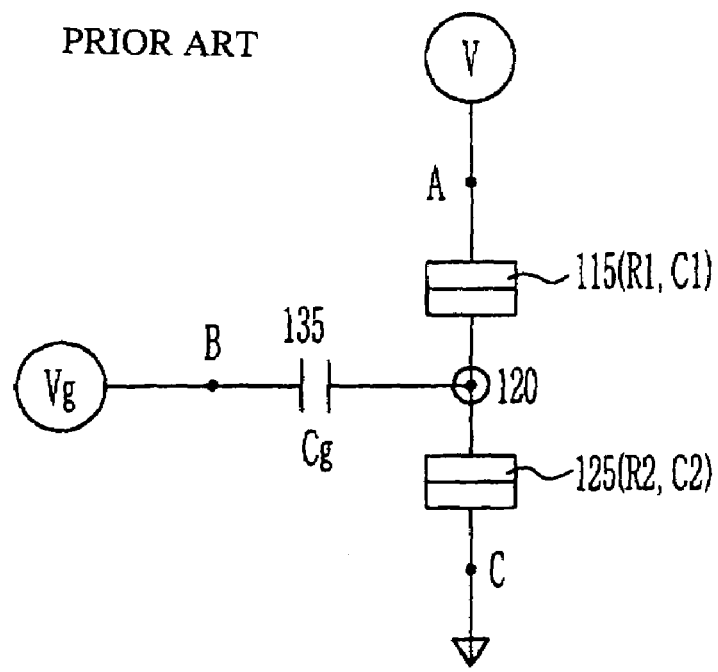
FIG. 1 shows a schematic view of a single electron transistor of the prior art having a structure similar to that of an MOSFET.
Figure 2:
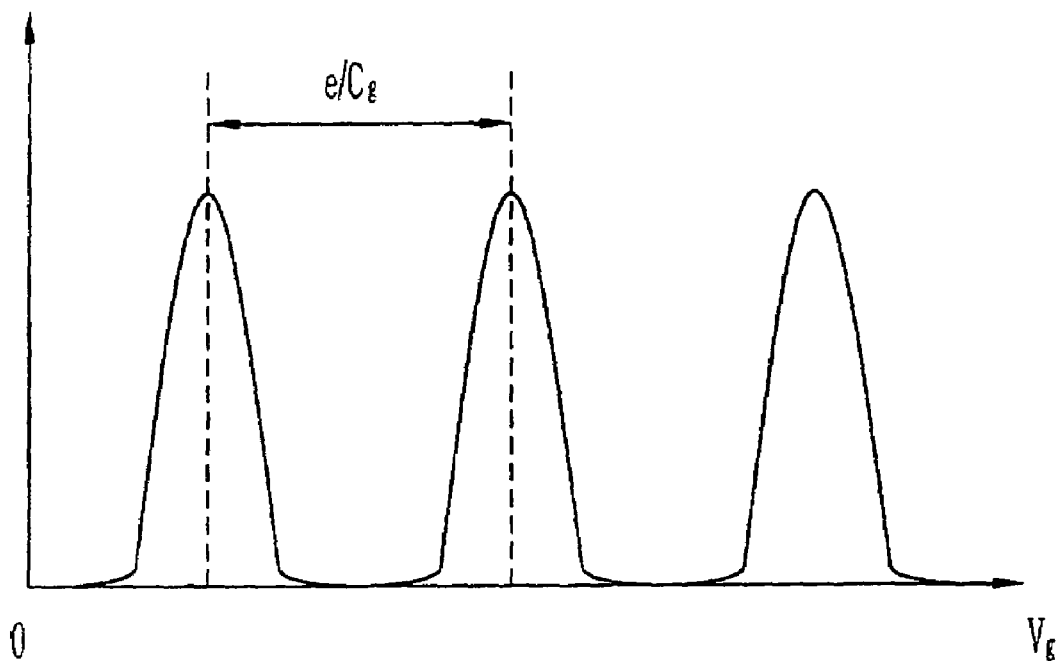
FIG. 2 shows a concept view for explaining operation principle of the single electron transistor.
Figure 3:
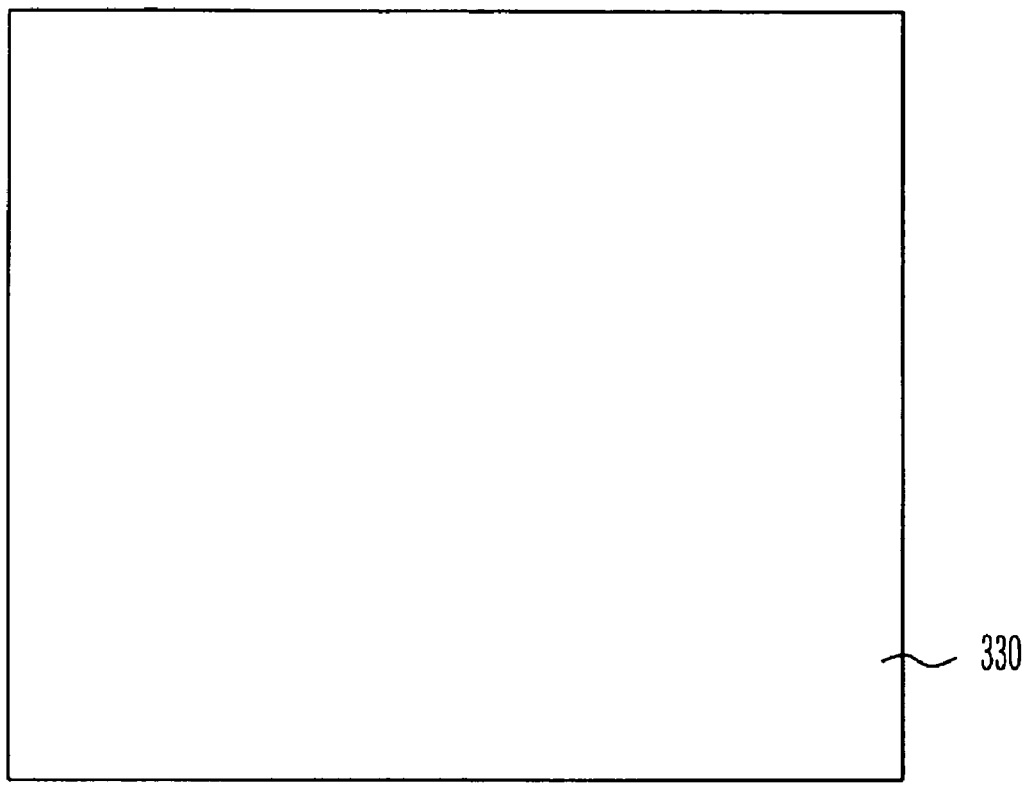
FIG. 3 shows an SOI substrate as a semiconductor substrate to which the preferred embodiment of the present invention is applied.
Figure 3:
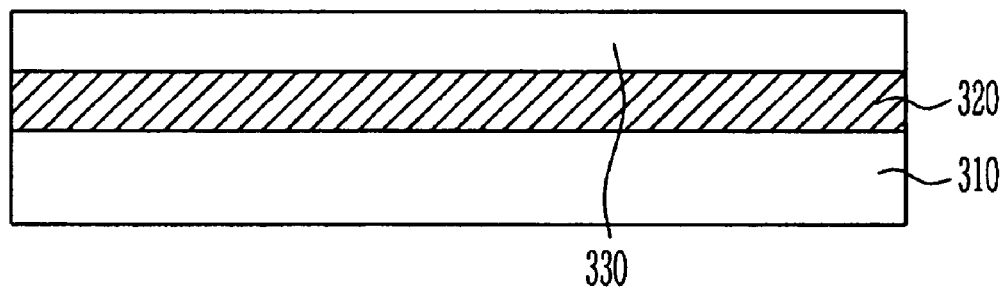

Referring to FIG. 3, an SOI (silicon on insulator) substrate is shown as an example of a semiconductor substrate. A typical SOI substrate is formed by stacking a single crystalline semiconductor layer 330 and an insulating film 320 in this order on a supporting substrate 310 formed of a silicon substrate. However, although the SOI substrate is shown as an example in the present embodiment, single crystalline semiconductor substrate such as general silicon wafers and various compound semiconductors can be used for the SOI substrate. The upper part of FIG. 3 is a plain view of the SOI substrate, and the lower part shows a sectional view of the SOI substrate.

Hereinafter, in the SOI substrate mentioned above, a region where the single electron device is formed is illustrated in FIGS. 4A to 11A, and a region where the MOS transistor is formed is illustrated in FIGS. 4B to 11B. The procedure for forming the single electron device and the MOS transistor which are to be formed in different positions on the same substrate will be described in detail.

Figure 4A:
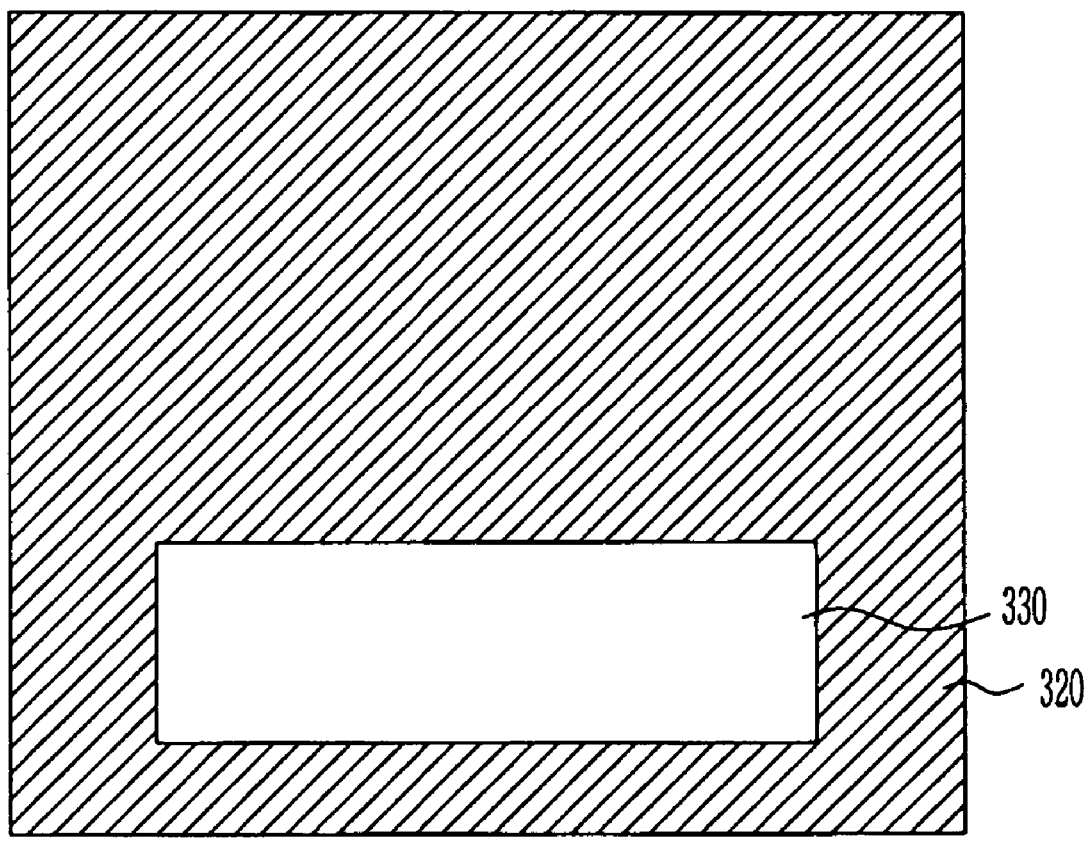
Figure 4A:
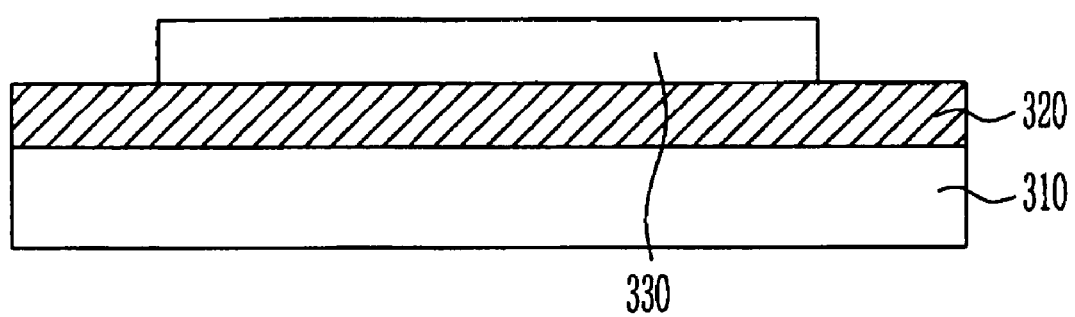
Figure 4B:
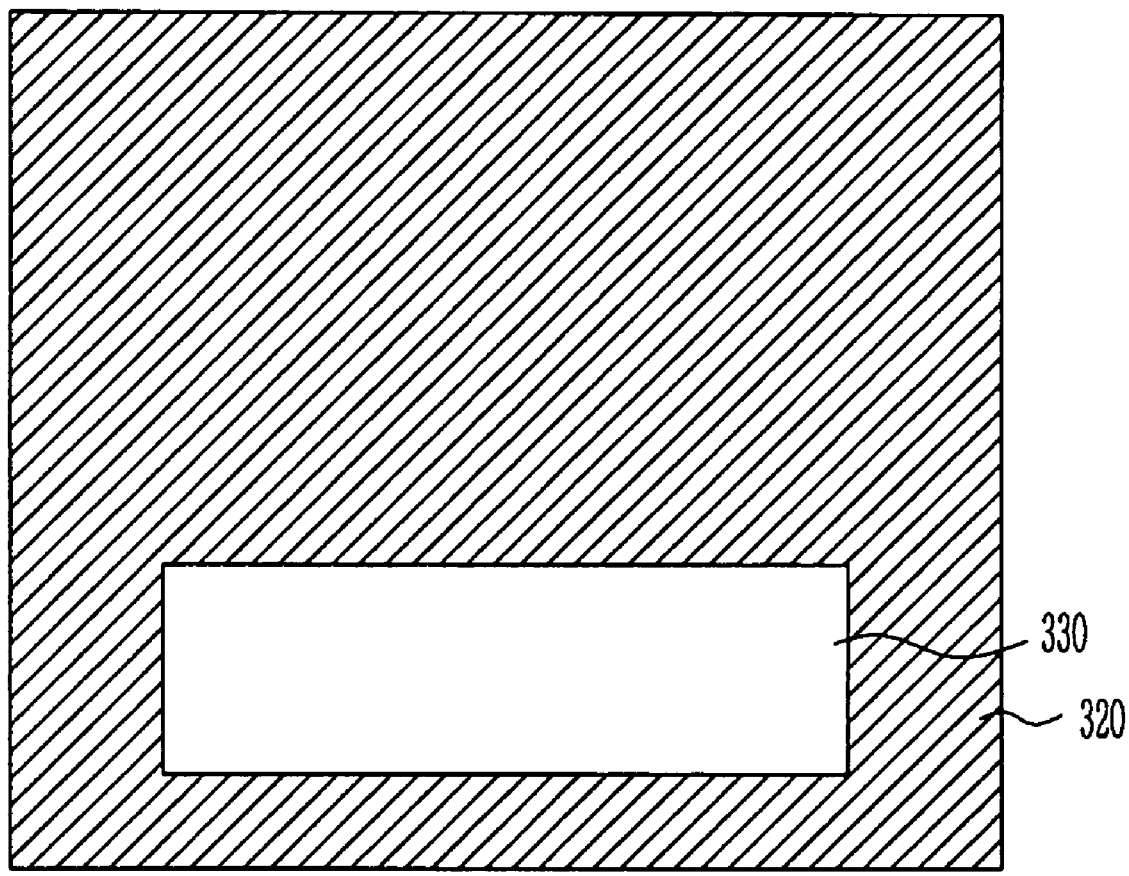
Figure 4B:
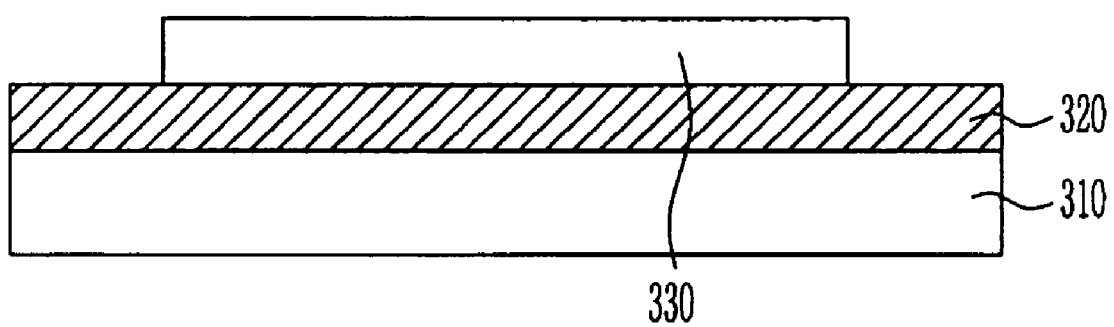

For convenience of explanation, FIGS. 4A and 4B show positions for forming the single electron transistor and the MOS transistor, respectively. However, it should be understood that they are formed in different positions on the same substrate in actual implementation. FIGS. 4A and 4B show patterning processes using photolithography and etching processes in order to define active layers in the single crystalline semiconductor layer 330 of each of the position A to form the single electron transistor and the position B to form the MOST transistor.

Figure 5A:
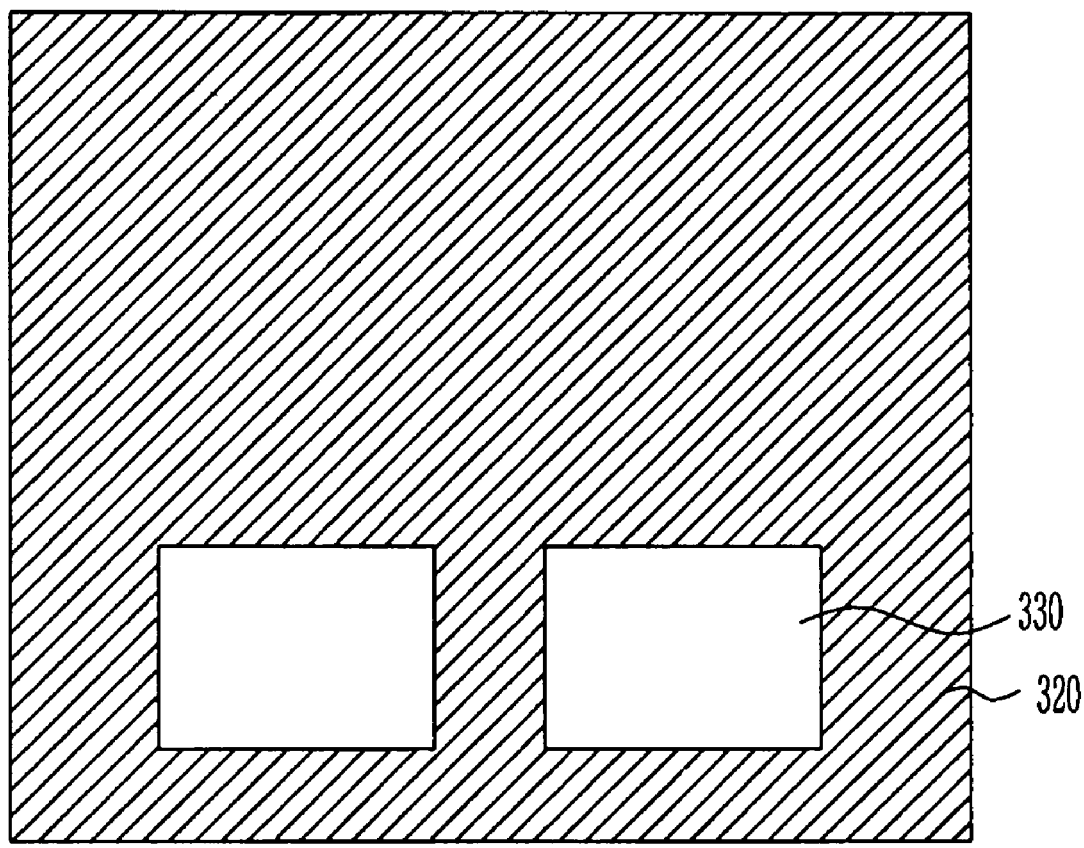
Figure 5A:
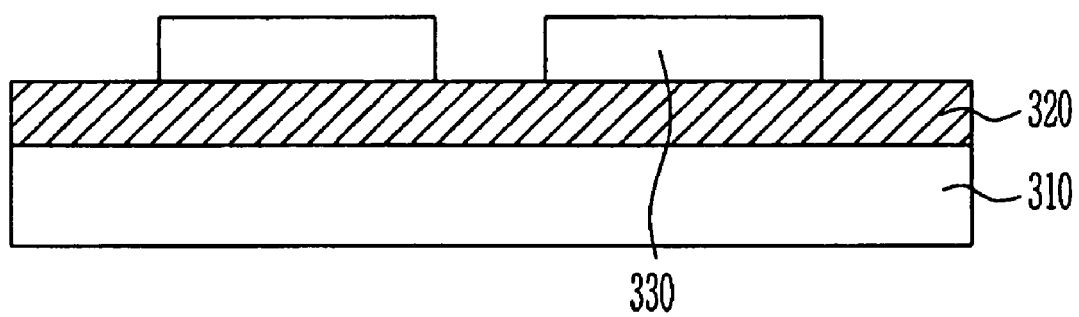
Figure 5B:
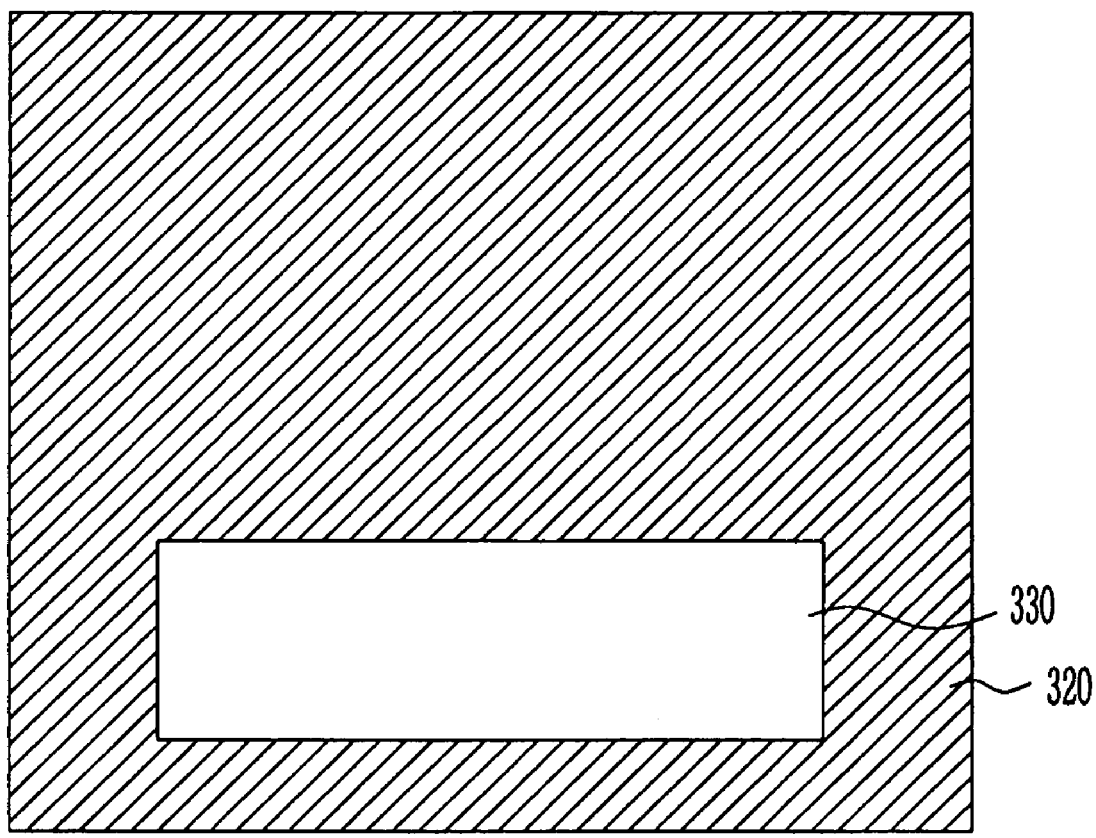
Figure 5B:
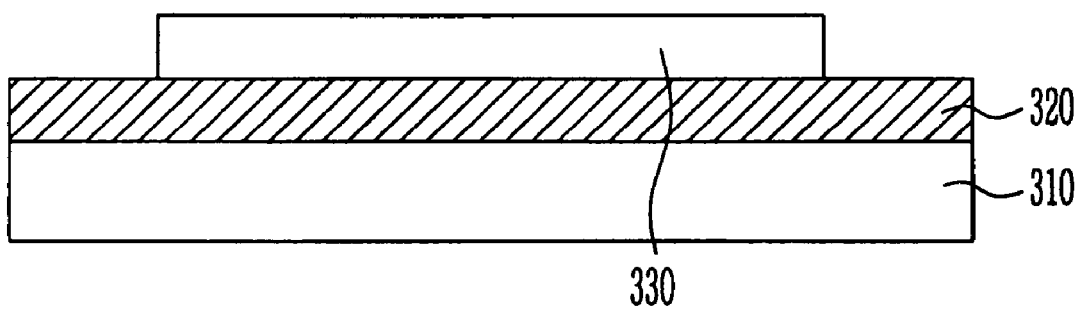

On the other hand, FIG. 5A shows the additionally etched channel portion of the single electron transistor. If necessary, the process of FIG. 4A may be omitted and the process of FIG. 5A may be used in FIG. 3 in accordance with the photolithography technology. However, since the channel region of the single electron transistor to be formed in FIG. 5A is extremely finer (e.g., about not more than 100 nm) than that of the active layer, if the technical difficulty levels are not high, it is impossible to directly proceed to the process of FIG. 5A with omitting any process of FIG. 4. At this time, in case length of the single electron channel is long, because charges should be tunneled through many electron islands, the resistance of the channel becomes too high. Therefore, the length of the channel should be properly, preferably not more than 100 nm, adjusted.

Figure 6A:
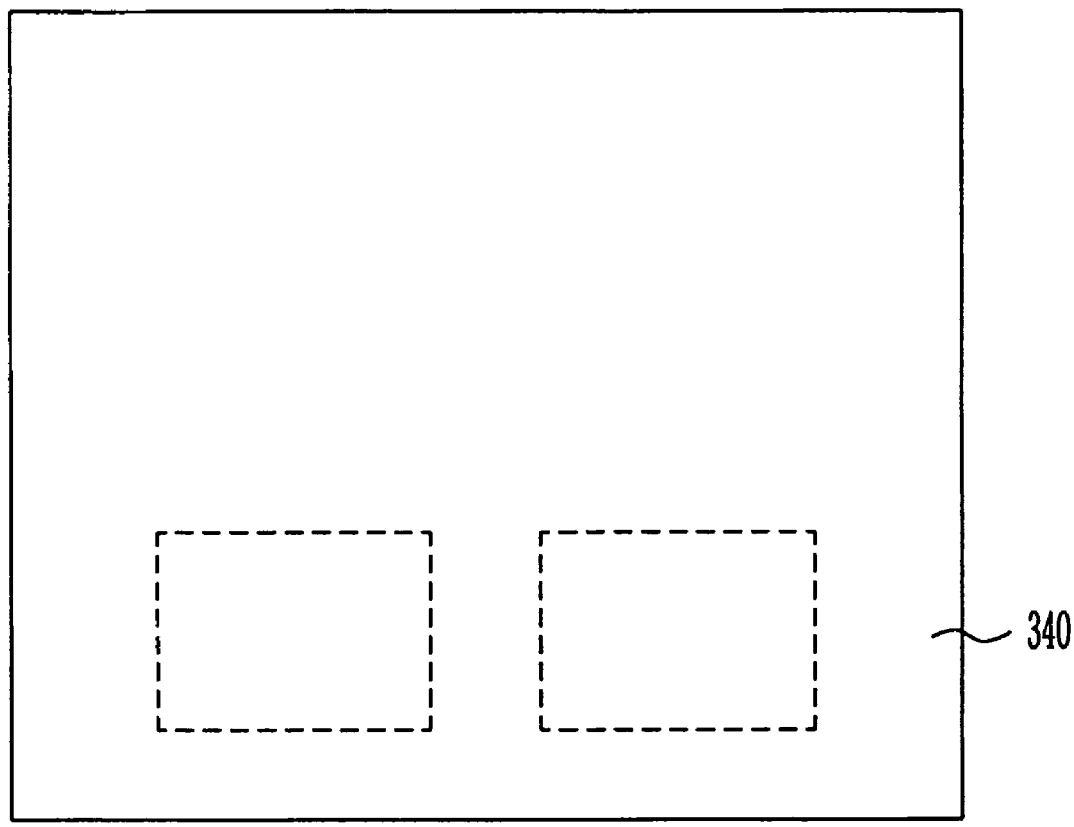
Figure 6A:
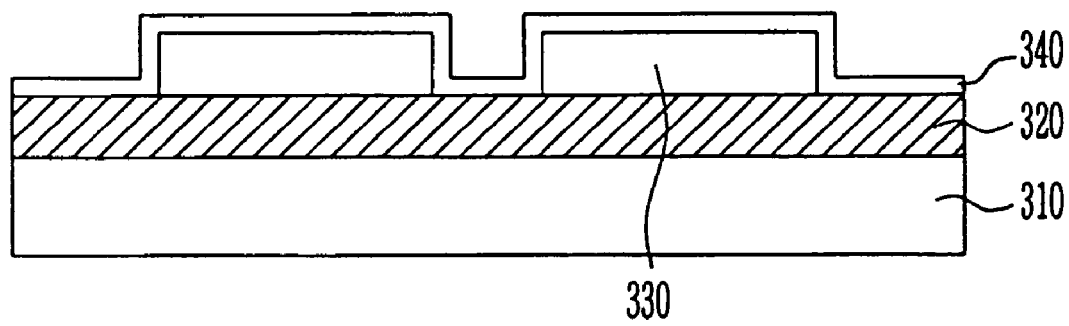
Figure 6B:
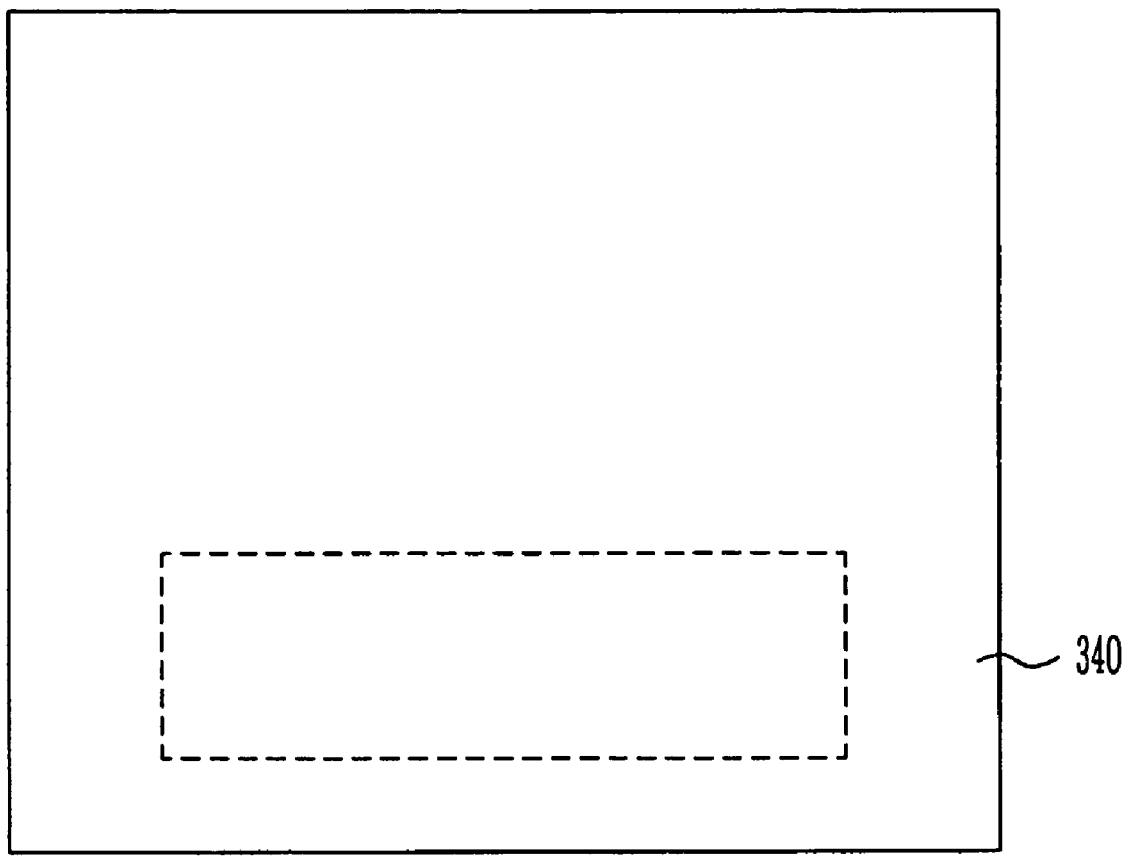
Figure 6B:
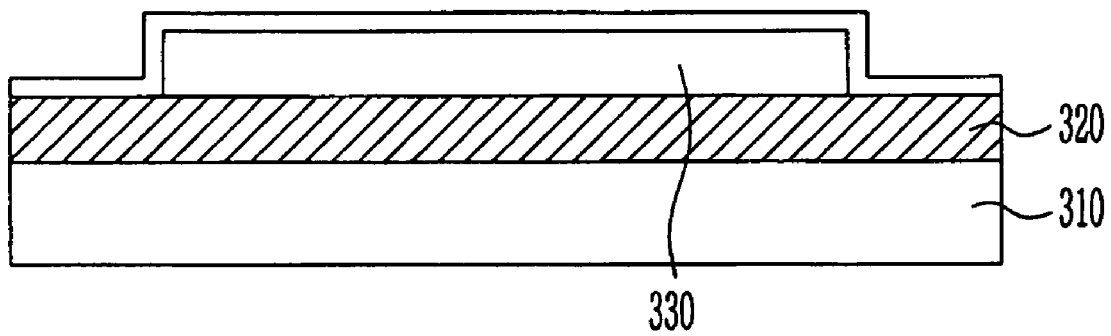

Next, referring to FIGS. 6A and 6B, an amorphous silicon layer 340 is deposited on the entire structure. In such case, it is preferable to form the amorphous silicon layer 340 to have a thickness of 20 nm or less. It is more preferable to deposit the amorphous silicon layer to have a thickness of 5 nm or less in order to effectively induce a quantum effect. In addition, although a polycrystalline silicone layer, an amorphous silicon layer, a doped amorphous silicon layer, etc can be used for forming a hemisphere body in the subsequent process, when the doped silicon or the polycrystalline silicon is deposited, because there is a disadvantage that characteristics of a final single electron transistor may not become uniform in case the hemisphere-type silicon is not formed uniformly, a doped-free amorphous silicon may be used. The amorphous silicon layer can be deposited at a temperature of 530° C. or less by using an LPCVD method. Typically, when the amorphous silicon layer is deposited at a temperature of 570° C. or more, it is deposited as the polycrystalline silicon layer.

Figure 7A:
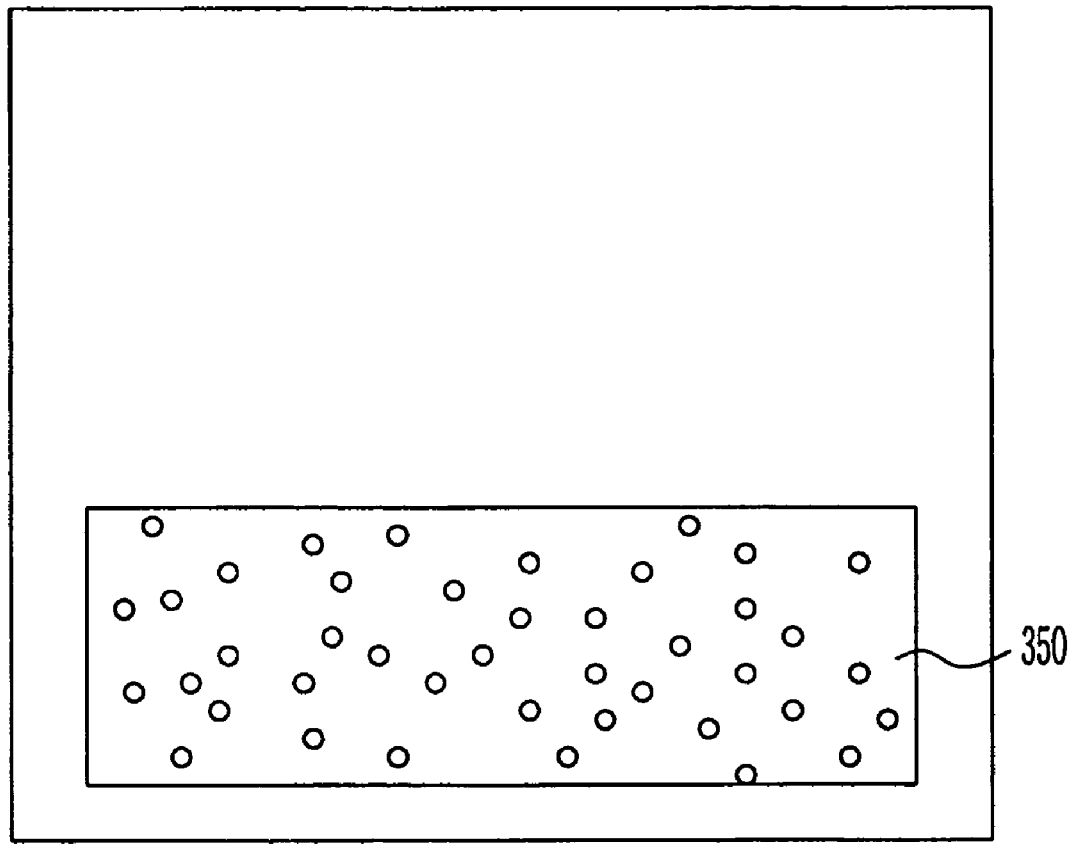
Figure 7A:
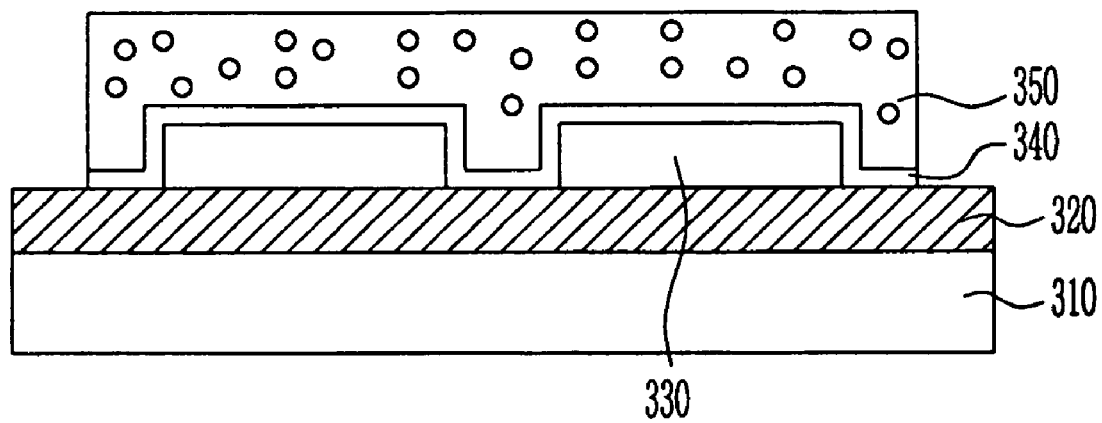
Figure 7B:
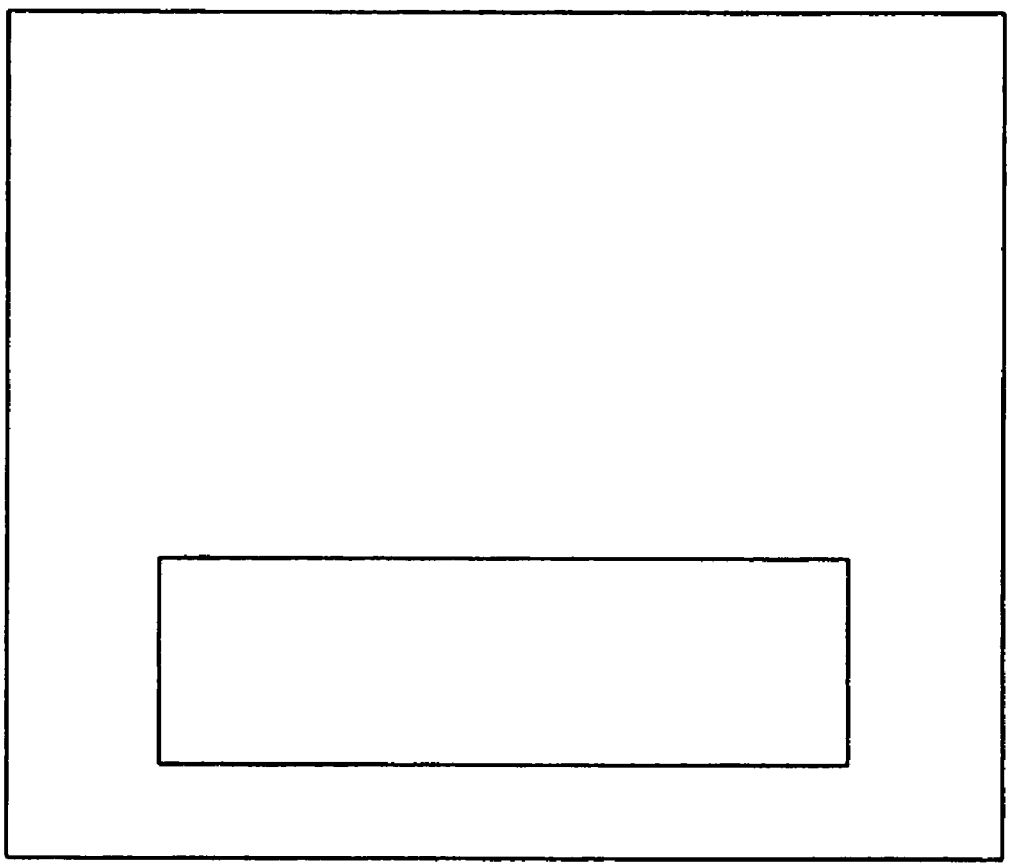
Figure 7B:
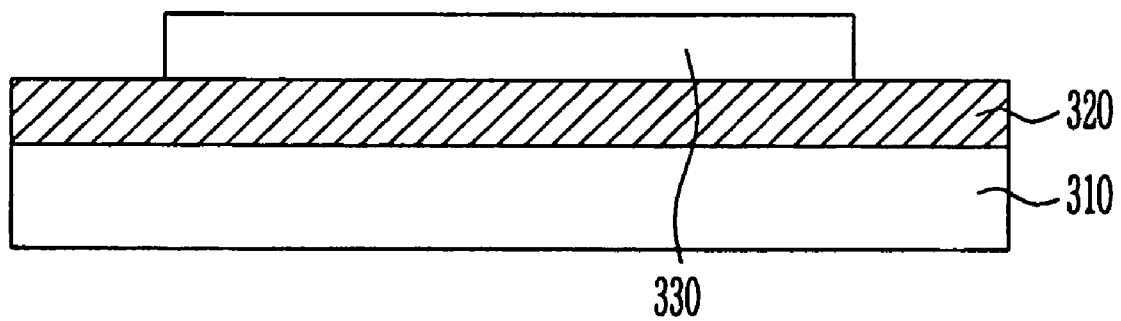

Referring to FIGS. 7A and 7B, excluding a portion in which a channel of single electron transistor is to be formed, the other portion of the amorphous silicon layer 340 is removed by using photolithography and etching processes. Although the portion including the active layer was covered with a photoresist 350 as a protection film, it is also possible to leave the amorphous silicon layer in which the channel is to be formed while not affecting the characteristics of other devices in consideration of process margin. In this case, the process of etching the amorphous silicon layer 340 is very important. Dry etching using plasma is not suitable for selectively etching the amorphous silicon layer 340 and the single-crystalline silicon layer 330, and when the single crystalline silicon of MOS transistor region B is exposed to the plasma, the silicon is damaged by the plasma, so that negative effect on device characteristics can occur in the future. In terms of such points, wet etching method that has high etching selection rate of the amorphous silicon layer and the single crystalline silicon layer is better than the dry etching method. Wet etching solution uses, for example, nitric acid+water+HF with a combination of 100:40:x. In this case, x is commonly 3, and the higher such value becomes, the less the etching selection rate of the amorphous silicon and the single crystalline silicon becomes, and vice versa.

Figure 8A:
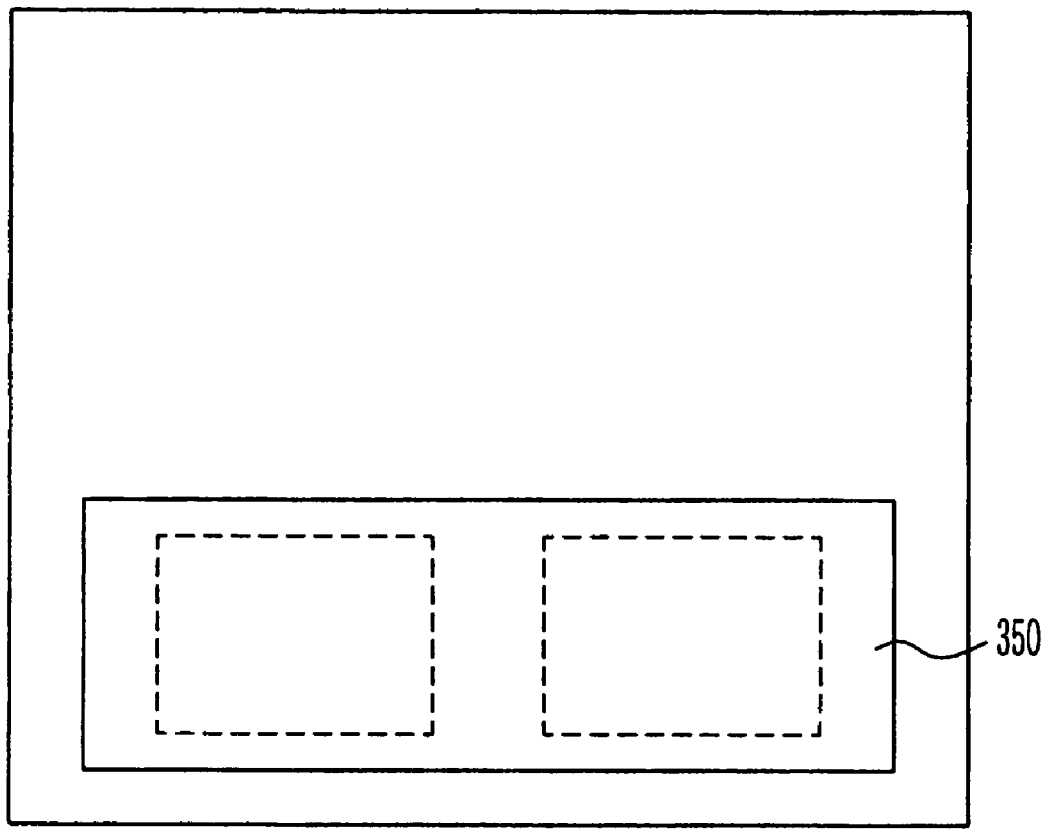
Figure 8A:
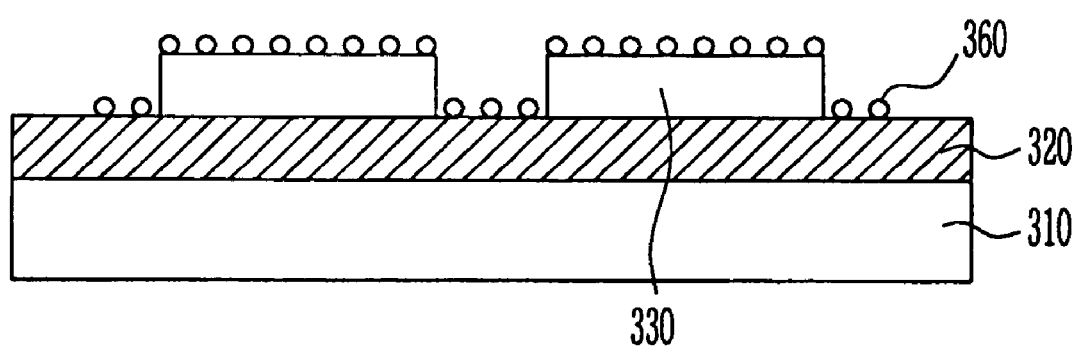
Figure 8B:
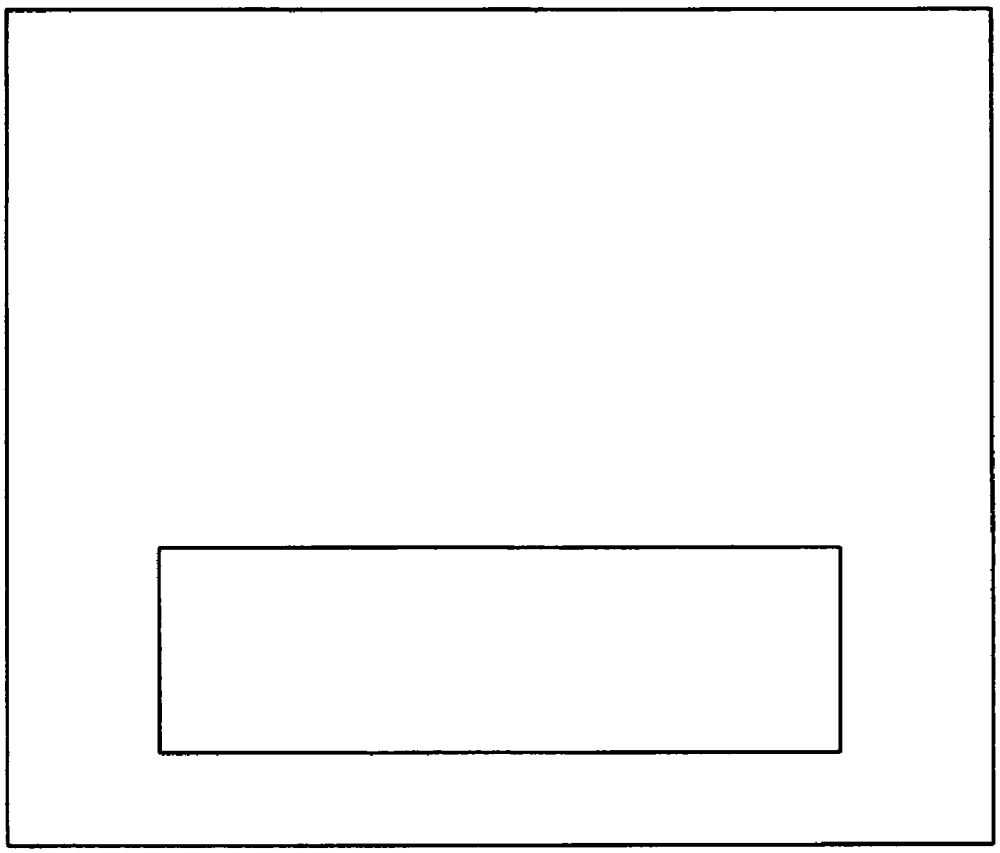
Figure 8B:
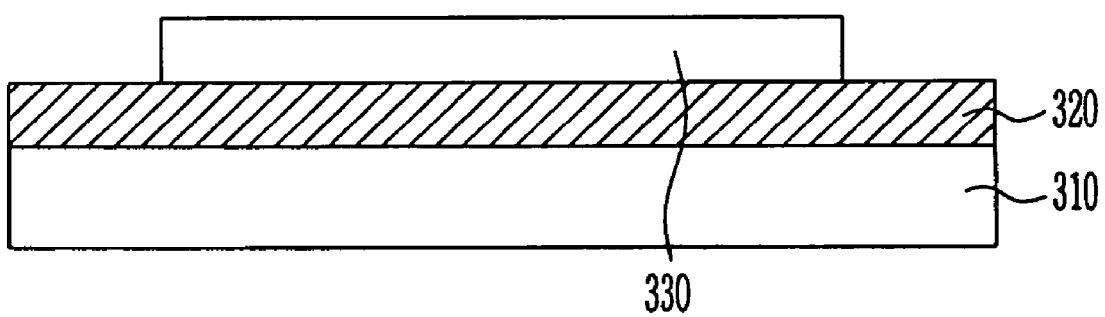

In addition, FIGS. 8A and 8B show that the hemisphere Grained silicon layer (HSG-Si) 360 is formed in a portion in which the amorphous silicon layer 340 is present. The process condition for forming the hemisphere Grained silicon layer 360 will be explained in detail as an example. First, a gas such as $SiH_4$, $Si_2H_6$, etc. including silicon is sprayed while maintaining high vacuum state at pressure of 1 to $3 \times 10E^{-7}$ Torr or less and at a constant temperature of 500 to 700° C. The spraying time is called a seed time $T_1$. Next, heat treatment is performed at a constant temperature of 500 to 700° C. (e.g., constant process temperature can be maintained throughout the whole process), on the basis of a temperature of wafer, at a temperature of about 600±30° C. (generally, a temperature for setting an equipment is higher than the temperature for the heat treatment by about 60 to 130° C.). Accordingly, the heating time is called a growth time $T_2$. Therefore, silicon nuclei are formed on the amorphous silicon layer 340 and silicon atoms are moved the silicon nuclei as a center, so that the hemisphere-type silicon grains are formed. In consideration of a preferred process condition, according to an experiment described later, grains of a size of about 7 nm were formed in an amorphous silicon layer having a thickness of about 5 nm. Meanwhile, to use the grains more effectively as single electron devices, the grain size is preferably in the range of 3 to 5 nm, and if the thickness of the amorphous silicon layer is in the range of 2 to 3 nm, the thickness of the formed HSG-Si layer 360 will be in the range of about 3 to 5 nm. However, this can be changed depend on the process temperature, seed time, growth time, etc. For example, the seed time can be adjusted from 10 to 170 seconds, and the growth time from 10 to 90 seconds.

Figure 9A:
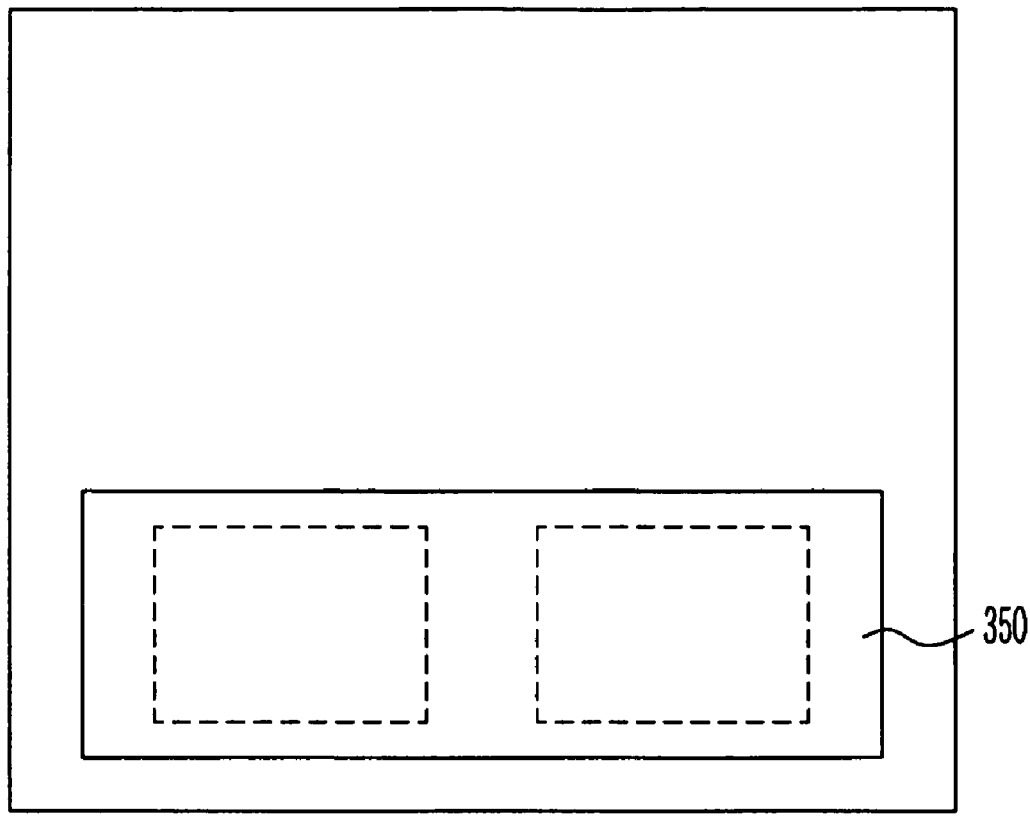
Figure 9A:
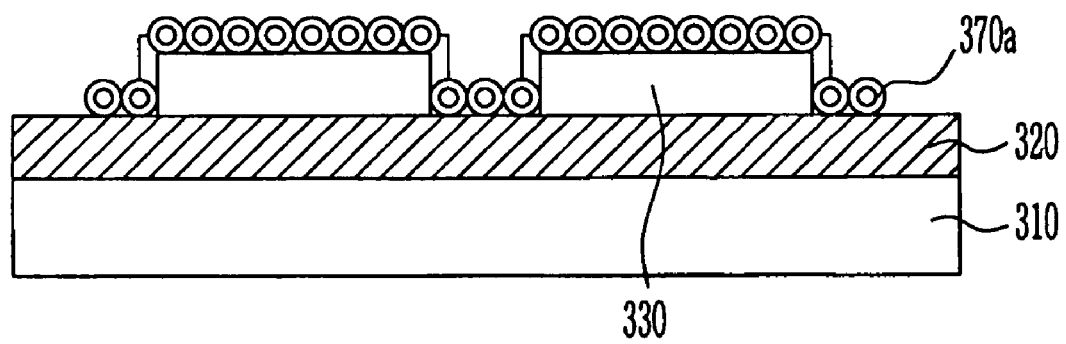
Figure 9B:
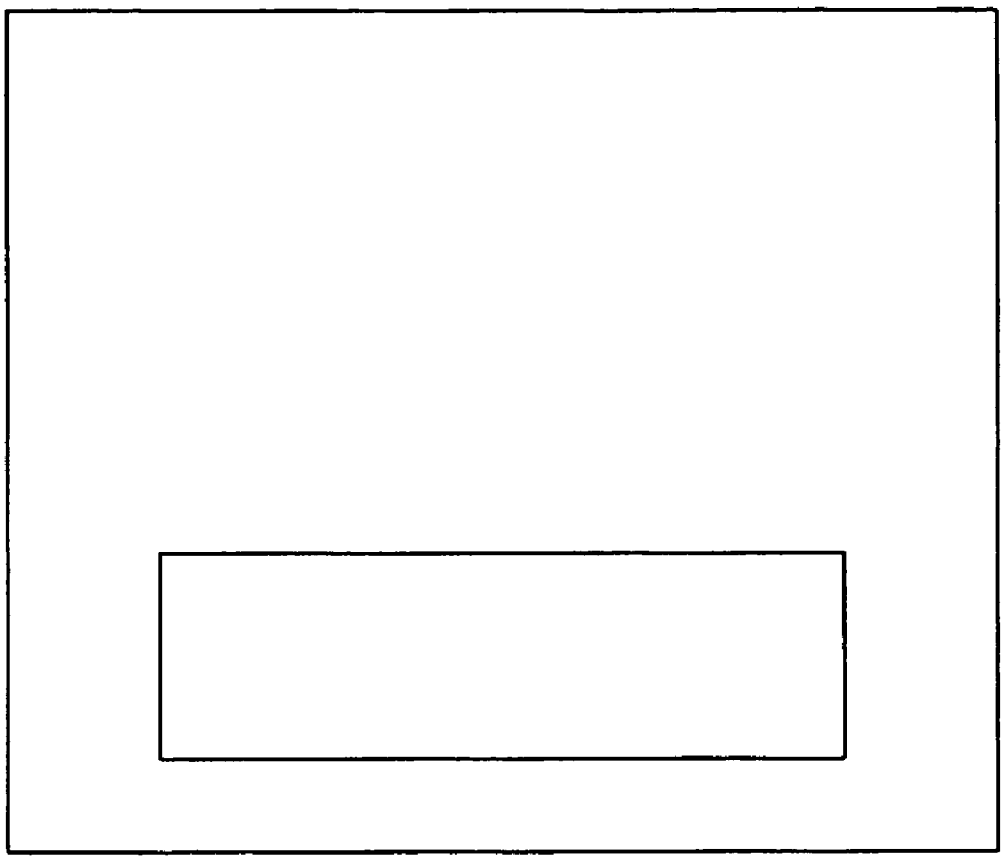
Figure 9B:
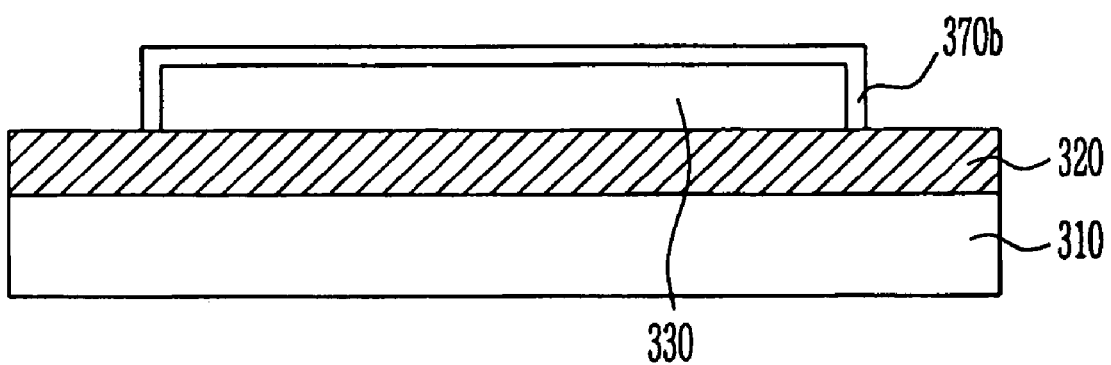

Next, referring to FIGS. 9A and 9B, gate oxidation films 370a and 370b are formed. The HSG-Si layers formed in FIG. 8A are not completely isolated, and are highly likely to be connected to each other with a shape of very thin silicon layer. Therefore, when oxidation process is performed, thin silicon layers between grains are oxidized, such that each silicon grain is completely isolated. The isolated grains function as electron islands and cause a Coulomb Blocking effect when the current flows, such that characteristic of single electron transistor can be obtained. The most important thing in forming gate oxidation films is preferably to make the thickness of an oxide needed for the single electron transistor different from the thickness of an oxide needed for the MOS transistor.

It is possible to transport electrons in the single electron transistor by making electrons move through tunnels between electron islands positioned between sources and drains. Therefore, there exist oxidation films between the electron islands, each electron island having very thin thickness in which tunneling can occur, e.g., a thickness of 10 to 15 Å. Further, since the gate electrode is overlapped with source and drain electrode, electrons are highly likely to move through the gate electrode other than electron islands when an oxidation film having very thin in which tunneling can occur exists in the overlapped portion. To prevent such phenomenon, except for an oxidation process, additional oxidation film is deposited thereon as a gate oxide of the single electron transistor in order to prevent such tunneling between the gate and the source or between the gate and the drain. Meanwhile, in the case of the MOS transistor, an oxidation film having proper thickness for the device characteristics may be formed.

An oxidation film of the MOS transistor can be made to 50 Å or less in thickness by oxidizing silicon with oxygen in a furnace at a temperature of 850° C. or less, and, in the case of an MOS device operating at a high speed, the thickness thereof can be accepted to 15 Å. Meanwhile, in the case of the single electron device, the oxidation film may be formed by depositing the oxidation film and then oxidizing it again in the furnace, and it is preferable to control the thickness of the oxidation film to about 50 Å, and the most representative method is to perform a deposition process using a combination of $SiH_4+O_2$ gas, or TEOS or $TEOS+O_2$ in an LPCVD apparatus.

In consideration of all of above conditions, it is preferable to form the gate oxidation film in the following steps. First, an oxidation film is entirely deposited using an LPCVD method, etc, for preventing tunneling between the gate electrode and the source/drain electrodes, and then a portion of oxidation film where the MOS transistor is to be formed is removed by photolithography and etching methods, and a photoresist is also removed. Next, cleansing and oxidation processes are performed on the whole structure, so that gate insulating film of a single electron device portion can be formed thicker than that of the MOS transistor portion. In other words, in the case of the single electron device portion where silicon islands exist, because these silicon layers between those electron islands are oxidized throughout additional oxidation process, it is preferable to electrically isolate them. However, it should be understood that such specific process can be modified to a process capable of making the thickness of gate insulation films of the single electron device portion different from that of the MOS transistor portion.

Figure 10A:
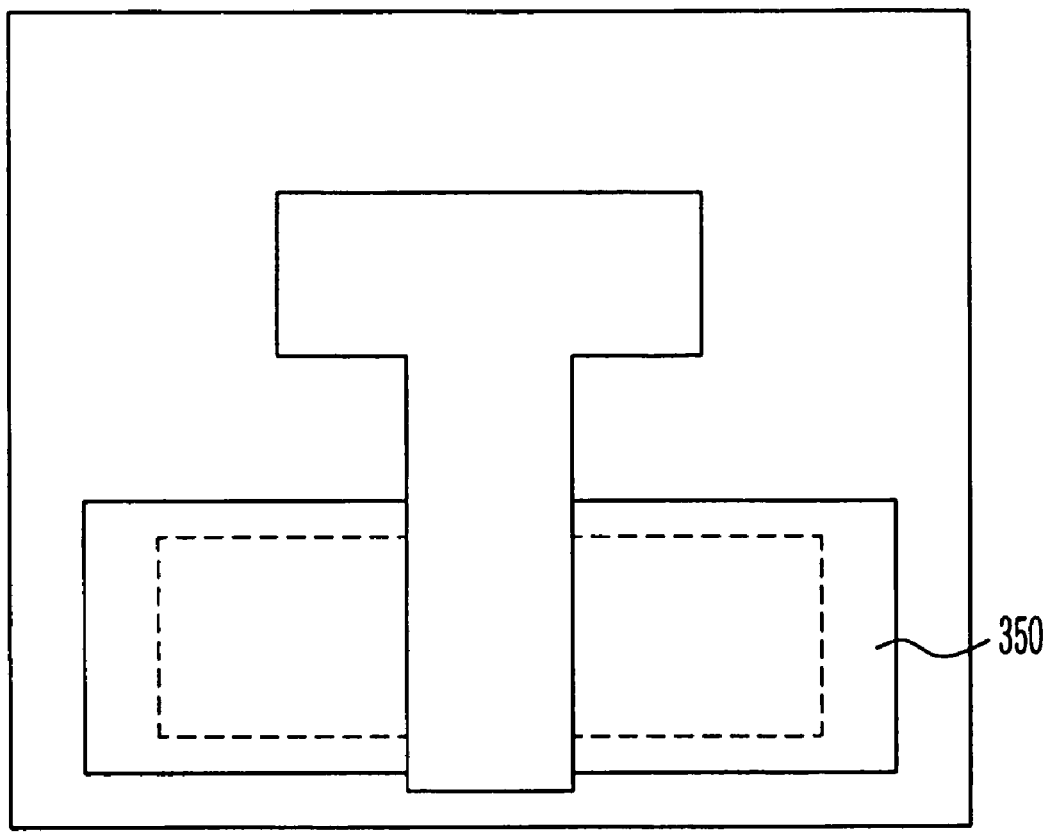
Figure 10A:
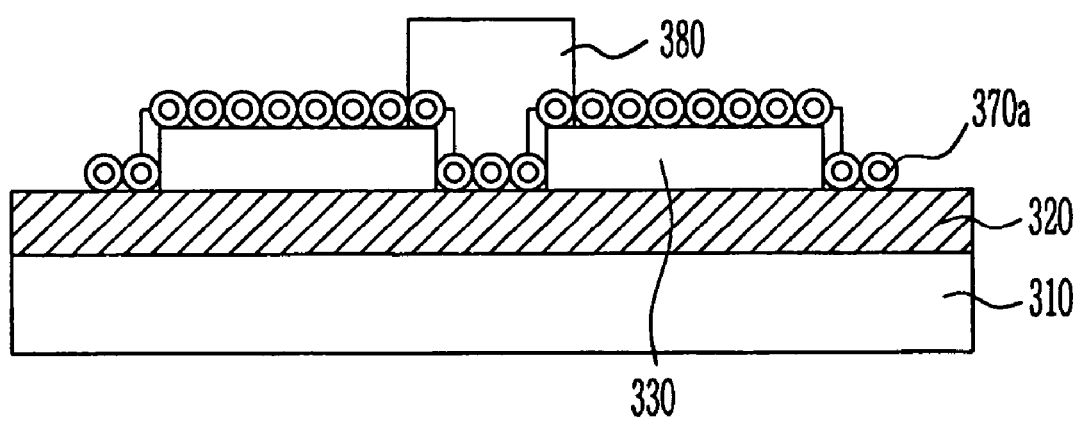
Figure 10B:
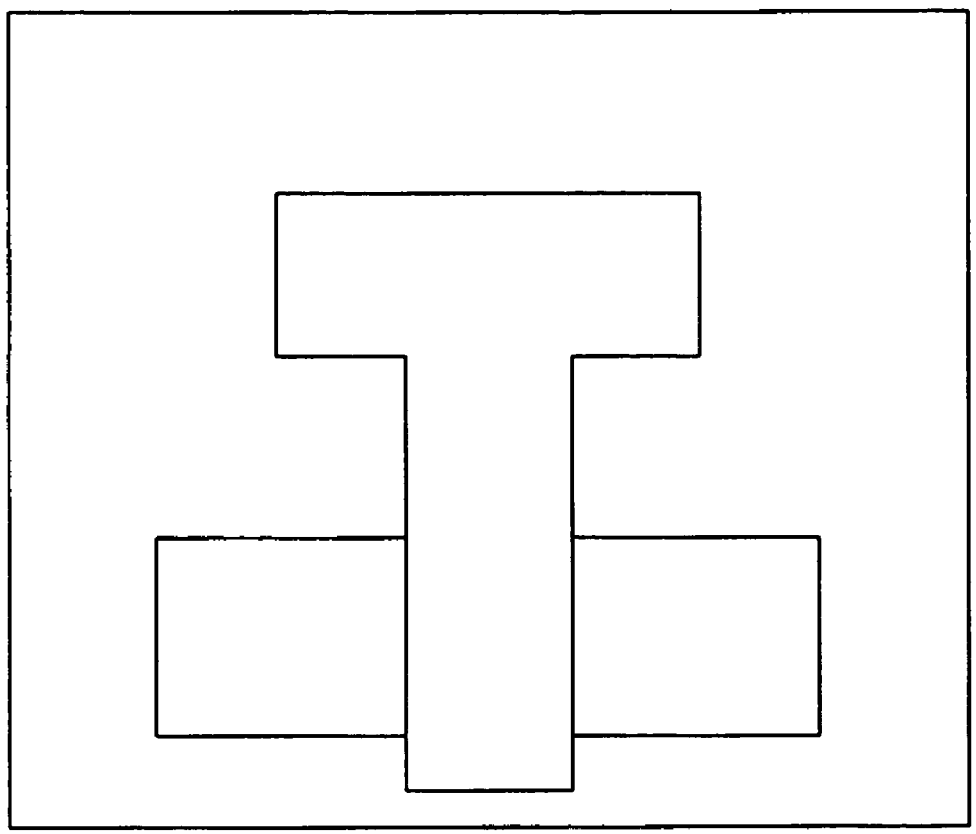
Figure 10B:
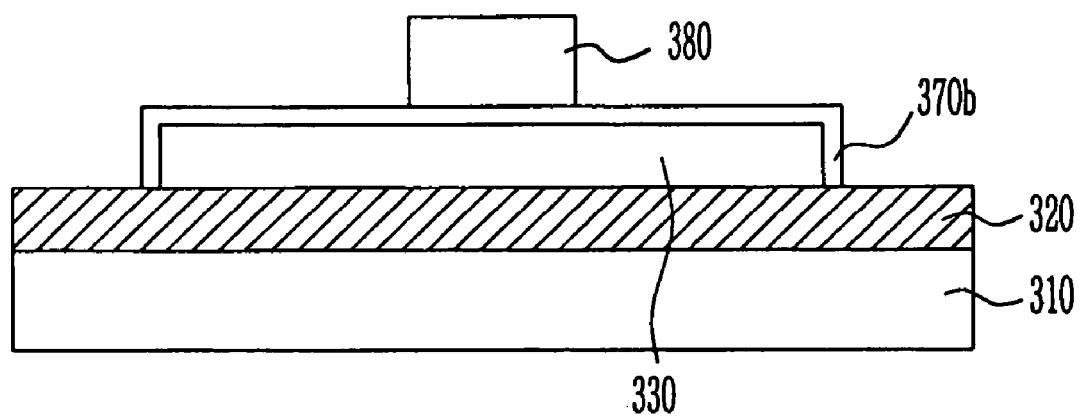

Next, referring to FIGS. 10A and 10B, after forming a gate electrode 380, doping process is performed in order to form the source and rain regions. And then, after forming side-walls like spacers, etc or oxidizing some of the lateral surface of the gate electrode, an LDD (Lightly Doped Drain) process can be added for stability of the device.

Figure 11A:
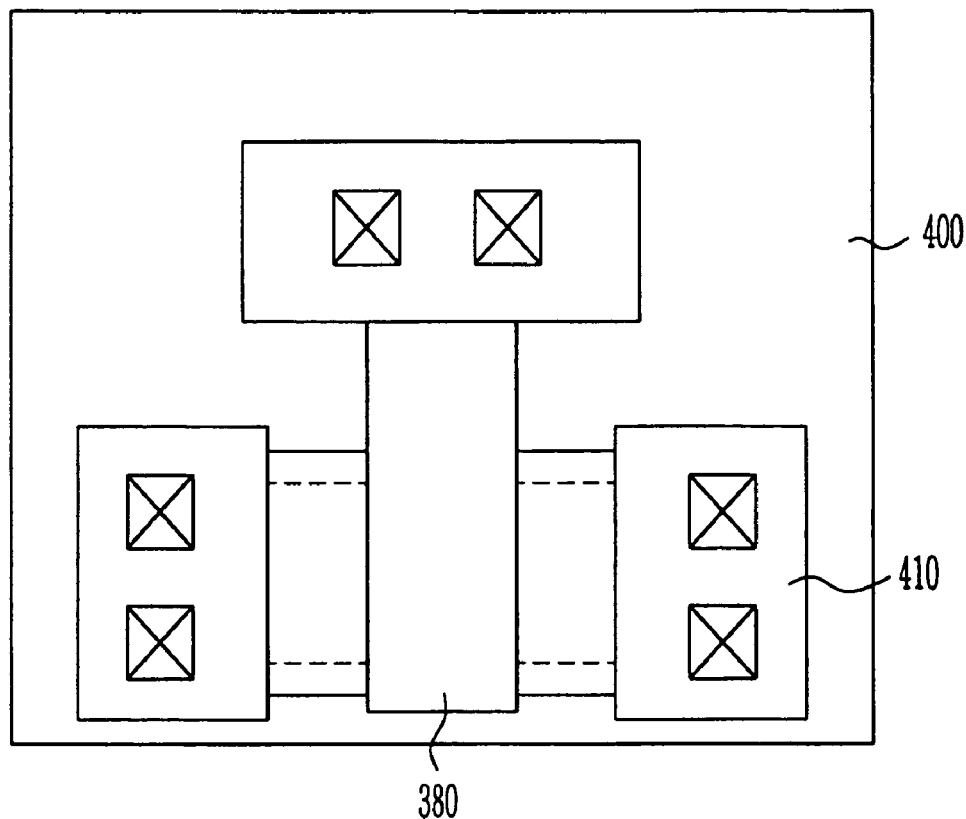
Figure 11A:
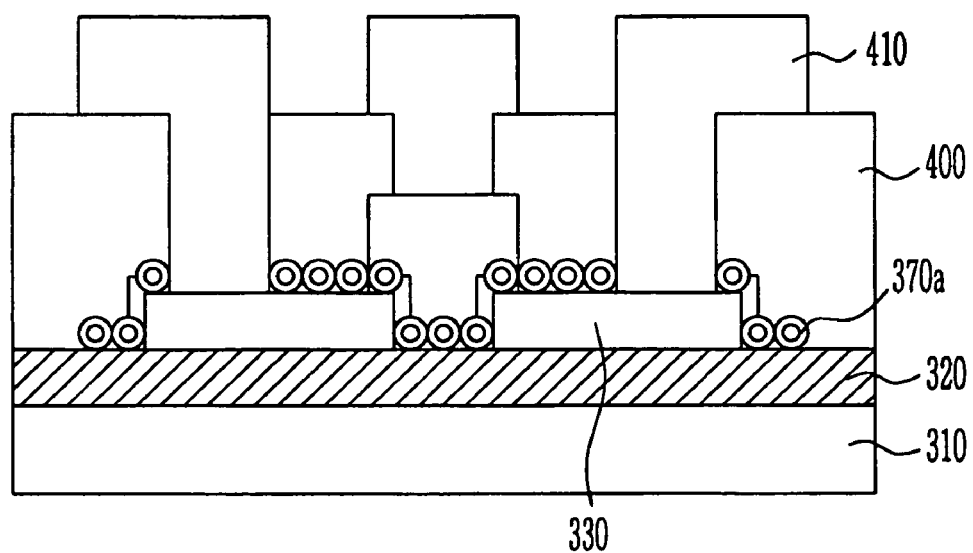
Figure 11B:
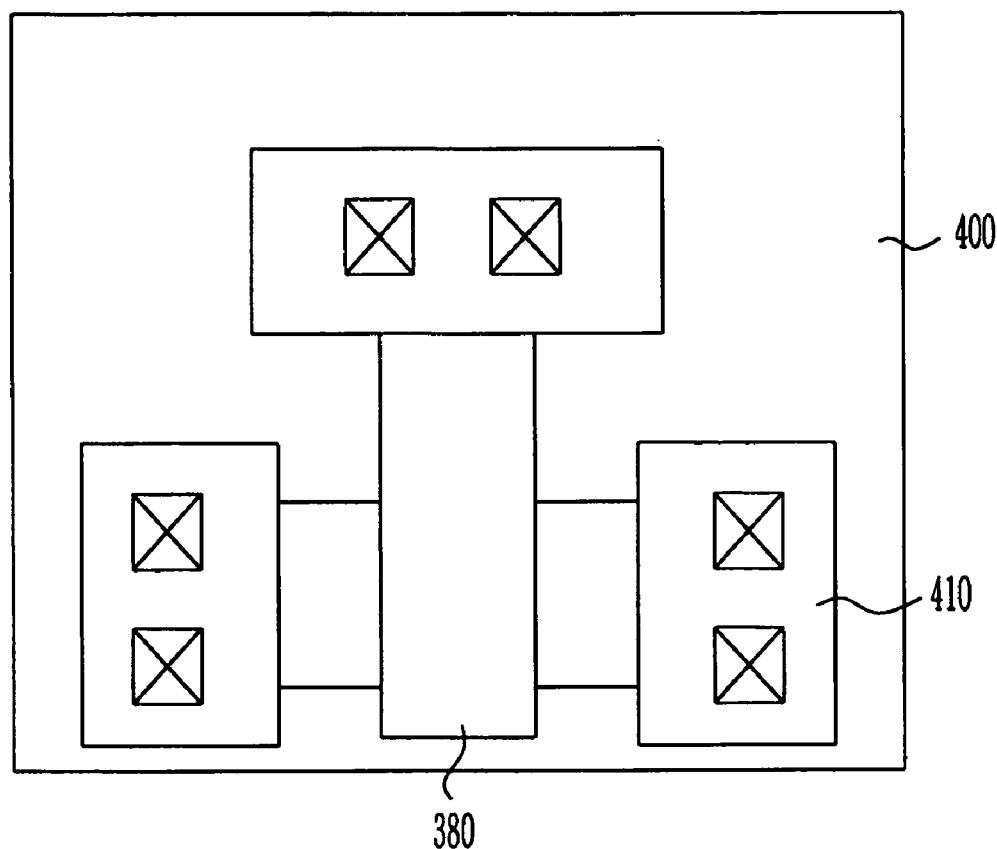
Figure 11B:
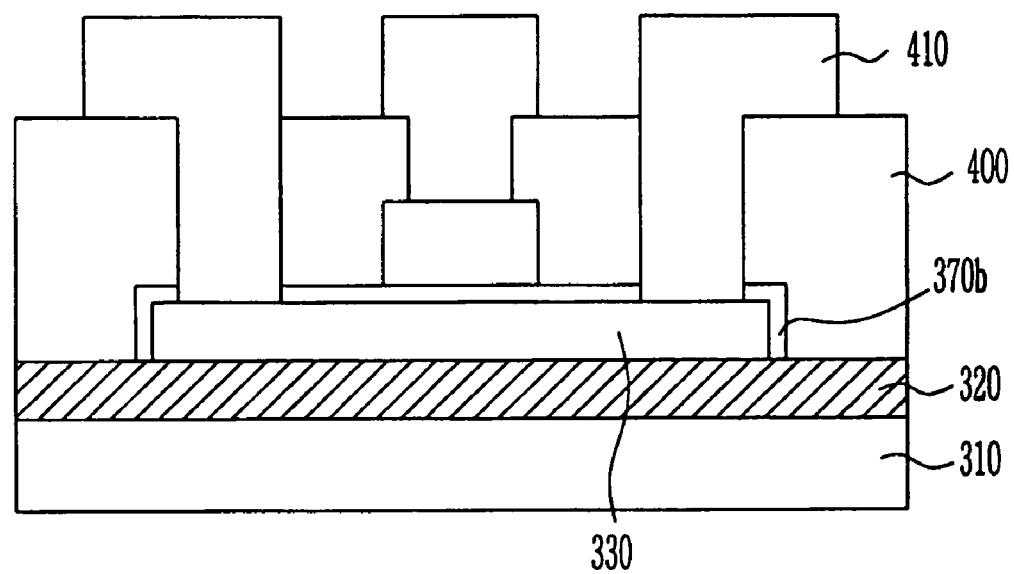

Next, FIGS. 11A and 11B show that a single electron device and an MOS transistor are finally formed at the same time by wiring the source/drain electrodes and the gate electrode with metal films 400 and 410. It is also possible to complete an integrated circuit by forming multi layered metal wirings before forming pads.

(Example of an Experiment)

Hereinafter, an experiment for forming the hemisphere-type silicon HSG-Si 360 in the portion where the amorphous silicon layer 340 exists will be described in detail.

First, oxygen-free amorphous silicon wafer is prepared as follows. Silicon oxide is thermally grown to 100 nm in thickness on an 8" p-type silicon 100 wafer. Next, an undoped amorphous silicon layer is deposited at a temperature of about 530° C. using an LPCVD method. The thickness of the amorphous silicon layer is changed to be in the range of 5 to 20 nm. Then, this sample is dipped into a 1% HF solution for 60 seconds to remove a natural oxidation film. Subsequently, an HSG process is performed. A Single wafer processor was used in the HSG process.

Detailed condition for the HSG process is as follows. Chamber pressure is about $10^{-7}$ Torr, and process temperature is changed from 580 to 600° C. The temperature of the process chamber is constantly maintained throughout the process.

The HSG process comprises three steps. First step is to stabilize a temperature of the sample. The sample is sufficiently heated to form nuclear atom site. After the sample is loaded into the process chamber, it is heated under a high vacuum state. About 60 seconds is available for stabilization temperature. Second step is to form nuclear atom site on the silicon surface by injecting silicon contained gas such as $SiH_4$ or $Si_2H_6$. The process time of the second step is defined as a seed time, 30 sccm of $Si_2H_6$ gas is injected and pressure of the chamber is $10^{-3}$ Torr. Third step is to grow a silicon crystal by annealing the sample under high vacuum state. The process time of the third step is defined as a growth time. Meanwhile, the seed time and the growth time affect the size and density of the silicon nano crystal. The experiment has been conducted by changing the seed time from 10 to 170 seconds, and the growth time from 10 to 90 seconds.

(1) First, when an amorphous silicon layer having a thickness of 20 nm, a growth temperature of 590° C. to 600° C., and a seed time of 90 to 150 seconds are used and the growth time is fixed as 90 seconds, sizes of nano dots were not greatly different from each other in accordance with process conditions, but the density of the nano dots differ depending on the process conditions. The lower the growth temperature becomes and the longer the seed time becomes, the higher the density of the silicon dots become. Since the nuclear atoms are formed during the seed time, the density of nano dots is mostly determined by the seed time. Increase of the seed time means the increase of the nuclear atom, thereby leading to an increase of nano dots.

Figure 12A:
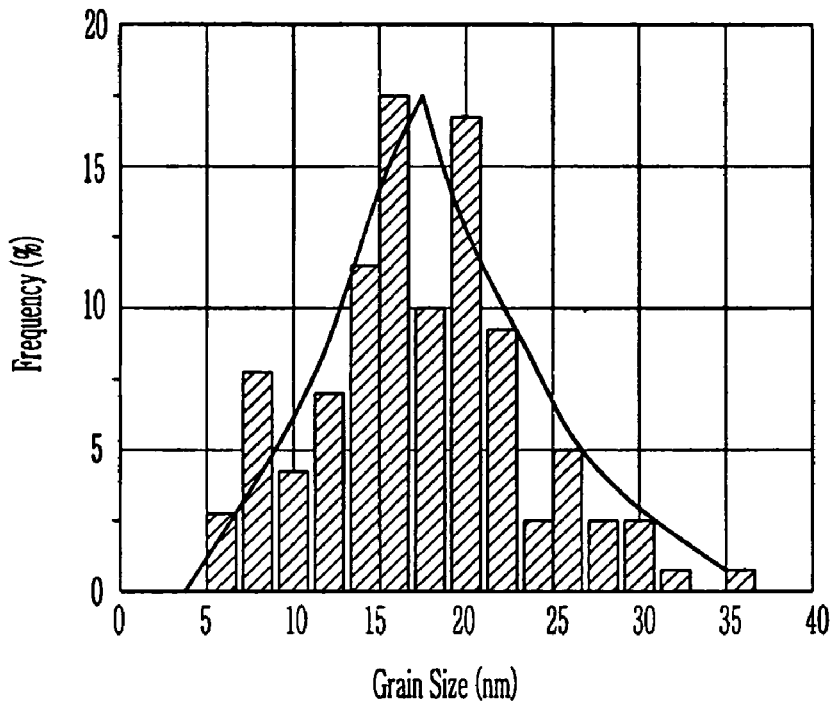
FIGS. 12A to 12C show a distribution of silicon nano dots obtained from an experimental example of the present invention.
Figure 12B:
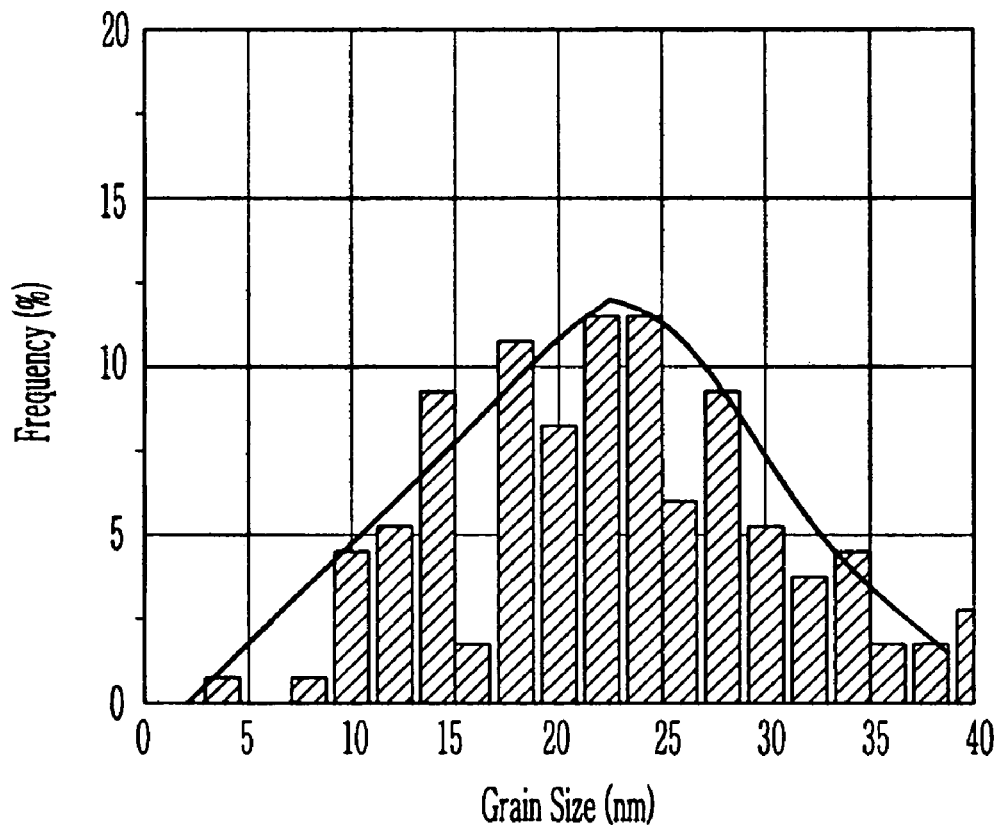
Figure 12C:
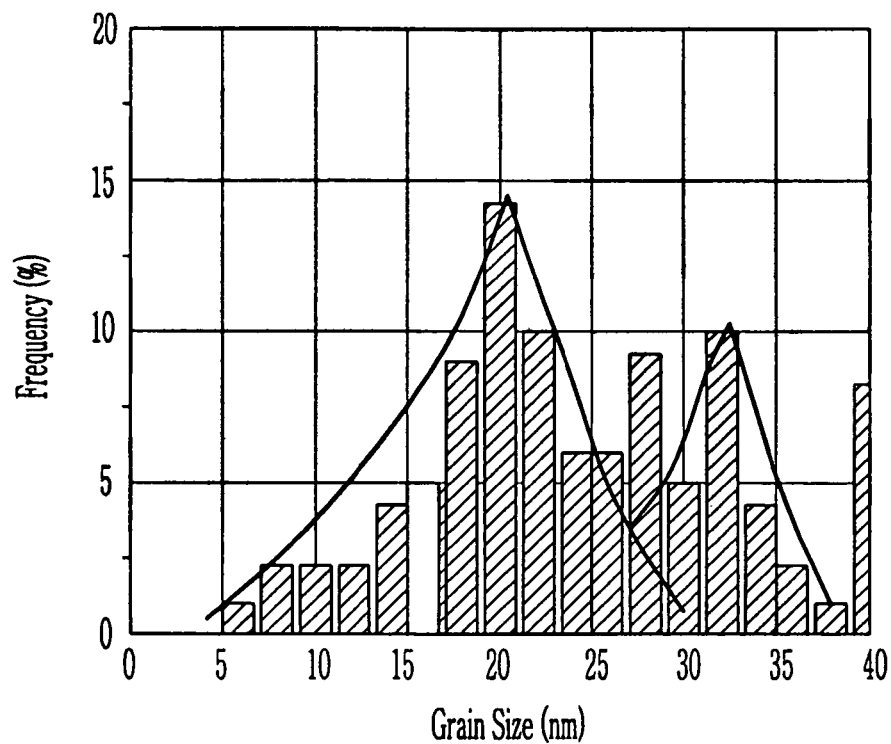
Figure 13A:
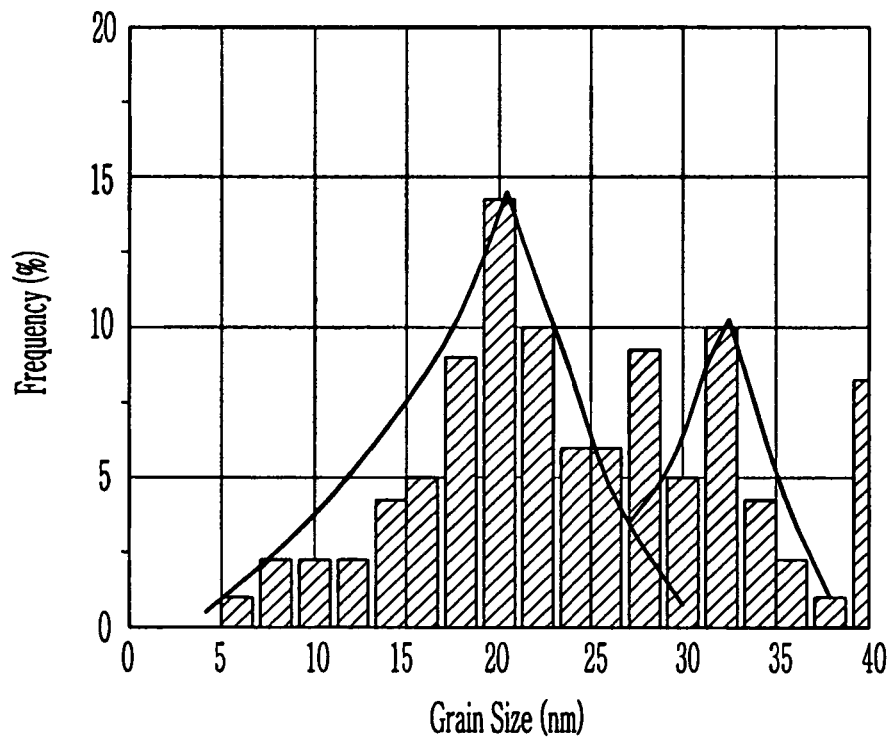
FIGS. 13A to 13C show a distribution of silicon nano dots obtained from an experimental example of the present invention.
Figure 13B:
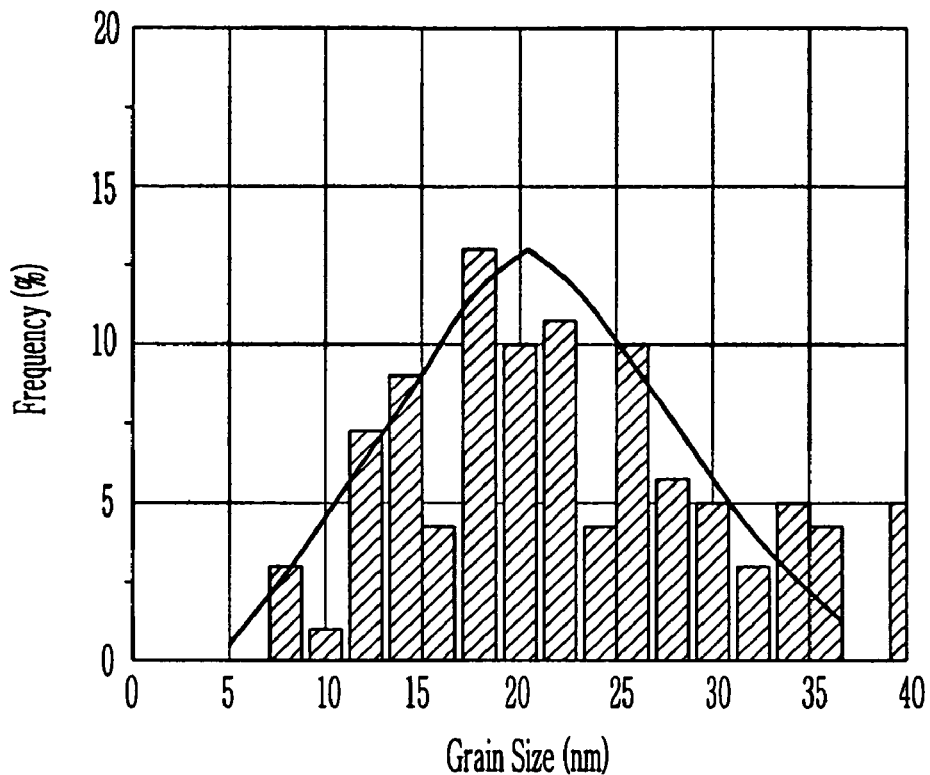
Figure 13C:
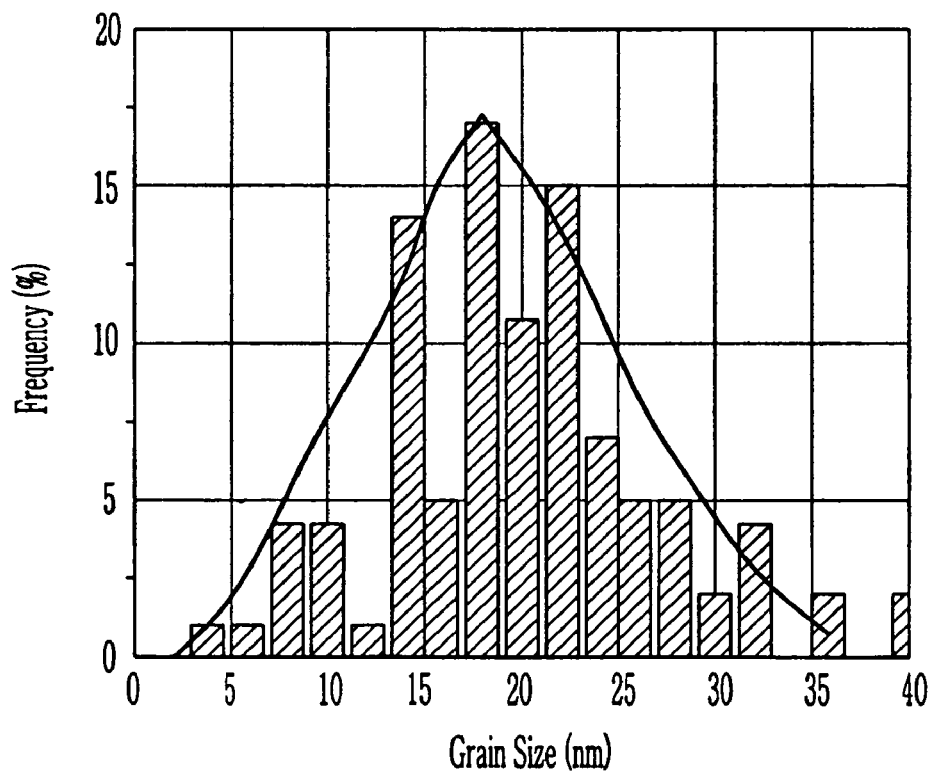

(2) Next, an amorphous silicon layer having a thickness of 10 nm, a process temperature of 590° C., and a growth time of 90 seconds are used, and the seed time is changed from 90 to 130 seconds. FIGS. 12A to 12C show the size distribution of silicon nano dots obtained by the experiment performing above-mentioned conditions. FIG. 12A shows a case of the seed time of 90 seconds, FIG. 12B shows a case of the seed time of 110 seconds, and FIG. 12C shows a case of the seed time of 130 seconds. As can be seen from these drawings, increase of the seed time causes big grains and wide distribution. With the increase of the seed time, it is possible to create more nuclear atoms and make distances between nuclear atoms closer to each other so that they might be connected. The side robe of FIG. 12C shows the above-mentioned case. Since the connection between silicon nano dots is not preferable, it can be prevented by reducing the growth time. To make sure of this, experiment has been conducted by changing the growth time to 90 to 30 seconds under the process temperature of 590° C. and the seed time of 130 seconds. FIGS. 13A to 13C show the size distribution of the silicon nano dots resulted from the experiment. FIG. 13A shows a case of the growth time of 90 seconds, FIG. 13B shows a case of the growth time of 70 seconds, and the FIG. 13C shows a case of the growth time of 30 seconds. The more the growth time is decreased, the more the concentration of distribution is increased, and side robe is also decreased. However, the density of the silicon nano dots is likely to become low.

Next, the process temperature is decreased and the seed time is increased. Experiment has been conducted by changing the seed time from 130 to 170 seconds under the process temperature of 584° C. and the growth time of 30 seconds. However, the density of silicon nano dots is decreased.

From the above-mentioned experiments, decrease of the process temperature as well as decrease of the growth time increases density of the silicon nano dots. However, density could not be significantly increased only with changes of temperature and process time. Therefore, a method of decreasing the thickness of the amorphous silicon layer can be considered.

Figure 14:
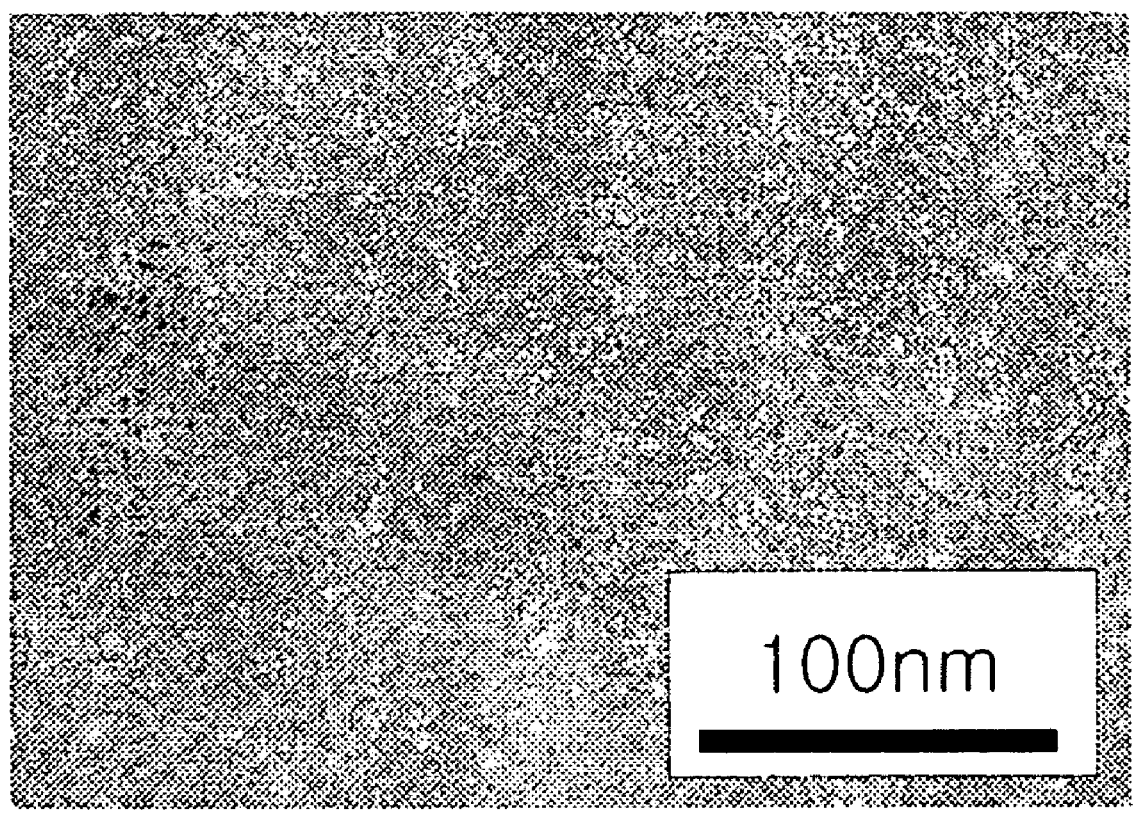
FIG. 14 shows an example of SEM images of silicon nano dots in accordance with the embodiment of the present invention.

(3) An amorphous silicon layer having a thickness of 5 nm, and the process temperature of 584° C. are used, and the growth time and the seed time are changed from 10 to 50 seconds, respectively. The density of silicon nano dots is significantly increased under this condition. Approximate density is about $2.6 \times 10^{11}/cm^2$ and there are some errors among SEM pictures. The grain size is about 7 nm. Therefore, when using thin amorphous silicon layer, it is possible to form silicon nano dots with higher density and uniformity. FIG. 14 illustrates the SEM image of silicon nano dots where the growth time and the seed time is 10 and 50 seconds, respectively.

As mentioned above, in the method of manufacturing the single electron transistor according to the process of the present invention, the electron islands are effectively formed using the hemisphere-type silicon forming technology. Further, based on such result, the method has compatibility with the existing manufacturing process based on the same. Therefore, because it is possible to not only ensure the manufacturing process to mass produce electron islands, to but also manufacture an integrated circuit mixed with the existing MOS transistor, very useful integrated circuit having mixed advantages of the MOS transistor and the characteristics of the single electron device in single chip can be manufactured.

Although the present invention has been described in conjunction with the preferred embodiment, the present invention is not limited to the embodiments, and it will be apparent to those skilled in the art that the present invention can be modified in variation within the scope of the invention.

What is claimed is:

1. A method of manufacturing a single electron device, the method comprising the steps of, on a substrate:

forming source/drain regions of a semiconductor layer, the source region and the drain region being spaced a predetermined distance apart from each other;

defining an active region between the source and the drain region by depositing an amorphous silicon layer on the semiconductor layer;

spraying a silicon containing gas to change the amorphous silicon layer into a hemisphere-type silicon layer having a plurality of silicon electron islands;

forming a gate insulating layer on the top surface of the entire structure; and forming a gate electrode on the gate insulating layer in order to apply voltages to the active region.

2. The method as claimed in claim 1, wherein the step of spraying the silicon containing gas comprises the steps of:

spraying the silicon containing gas for a first predetermined time while maintaining the amorphous silicon layer under the condition of a temperature of 500 to 700° C, and a high vacuum state not more than 1 to 3×10E-7 torr; and performing heat treatment for a second predetermined time at a temperature of 500 to 700° C.

3. The method as claimed in claim 2, wherein the silicon containing gas is $SiH_4$ or $Si_2H_6$.

4. The method as claimed in claim 2, wherein the first predetermined time is in the range of 10 to 170 seconds, and the second predetermined time is in the range of 10 to 90 seconds.

5. The method as claimed in claim 1, wherein the predetermined distance is 100 nm or less, the thickness of the hemisphere-type silicon layer is in the range of 3 to 5 nm, and the size of the silicon electron islands is in the range of 3 to 5 nm.

6. The method as claimed in claim 1, wherein the predetermined distance is 100 nm or less.

7. The method as claimed in claim 1, wherein the substrate is an SOI substrate, and the semiconductor layer is an uppermost layer of the SOI substrate.

8. A method of simultaneously manufacturing a single electron device and an MOS transistor, the method comprising the steps of:

defining a single electron device region (hereinafter, A region) and an MOS transistor region (hereinafter, B region);

depositing a semiconductor layer entirely on the A region and B region;

defining a source and drain region of the single electron device in the A region, the source and the drain region of the A region being spaced a predetermined distance apart from each other, and simultaneously defining a source, a drain, and an active region of the MOS transistor with one body in the B region;

after depositing an amorphous silicon layer on the semiconductor layer, defining an active region of the single electron device between the source and drain regions on the A region;

changing the amorphous silicon layer of the A region into a hemisphere-type silicon layer having a plurality of silicon electron islands;

forming a gate insulating layer on the top surface of the entire structure;

forming a gate electrode on the gate insulating layer; and forming source/drain electrodes of the single electron device and the MOS transistor.

9. The method as claimed in claim 8, wherein the step of forming the gate insulating layer comprises the steps of:

forming a first gate insulating layer on only the A region after covering the B region with photo-resist; and forming a second gate insulating layer on the entire structure, wherein the thickness of the gate insulating layer in the A region is bigger than that of the gate insulating layer in the B region.

* * * * *